United States Patent
Patel et al.

(10) Patent No.: US 8,483,996 B2
(45) Date of Patent: Jul. 9, 2013

(54) CONTROLLED COOLING OF A DATA CENTER

(75) Inventors: Chandrakant D. Patel, Fremont, CA (US); Ratnesh K. Sharma, Union City, CA (US); Cullen E. Bash, San Francisco, CA (US); Abdlmonem H. Beitelmal, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 20 days.

(21) Appl. No.: 13/173,963

(22) Filed: Jun. 30, 2011

(65) Prior Publication Data

US 2011/0263193 A1    Oct. 27, 2011

Related U.S. Application Data

(62) Division of application No. 11/503,654, filed on Aug. 14, 2006, now abandoned, which is a division of application No. 10/157,892, filed on May 31, 2002, now Pat. No. 7,114,555.

(51) Int. Cl.
*G06F 17/50* (2006.01)

(52) U.S. Cl.
USPC ............................. 703/1; 700/252

(58) Field of Classification Search
USPC ................. 703/1; 165/247; 700/252
See application file for complete search history.

(56) References Cited

U.S. PATENT DOCUMENTS

| | | | |
|---|---|---|---|
| 4,406,397 A | 9/1983 | Kamata et al. | |
| 4,783,970 A | 11/1988 | Takahashi | |
| 4,821,526 A | 4/1989 | Otsuka et al. | |
| 4,830,095 A | 5/1989 | Friend | |
| 5,062,276 A * | 11/1991 | Dudley | 62/176.6 |
| 5,139,197 A | 8/1992 | Seshimo et al. | |
| 5,179,524 A | 1/1993 | Parker et al. | |
| 5,186,418 A | 2/1993 | Lauritsen | |
| 5,209,398 A | 5/1993 | Drees | |
| 5,303,561 A | 4/1994 | Bahel et al. | |
| 5,417,077 A | 5/1995 | Jeffery et al. | |
| 5,417,368 A | 5/1995 | Jeffery et al. | |
| 5,426,951 A | 6/1995 | Yamashita et al. | |
| 5,544,697 A | 8/1996 | Clark | |
| 5,572,878 A | 11/1996 | Kapoor | |
| 5,581,478 A * | 12/1996 | Cruse et al. | 700/276 |
| 5,600,759 A * | 2/1997 | Karakama | 700/252 |
| 5,628,201 A | 5/1997 | Bahel et al. | |
| 5,675,514 A | 10/1997 | Lefebvre | |
| 5,811,055 A | 9/1998 | Geiger | |
| 5,823,004 A | 10/1998 | Polley et al. | |
| 5,936,240 A | 8/1999 | Dudar et al. | |
| 5,979,167 A | 11/1999 | Kochavi et al. | |
| 5,999,881 A * | 12/1999 | Law et al. | 701/301 |
| 6,102,113 A | 8/2000 | Cowans | |
| 6,104,003 A | 8/2000 | Jones | |
| 6,255,793 B1 * | 7/2001 | Peless et al. | 318/580 |
| 6,308,776 B1 | 10/2001 | Sloan et al. | |
| 6,397,963 B1 | 6/2002 | Lennevi | |
| 6,484,080 B2 | 11/2002 | Breed | |

(Continued)

*Primary Examiner* — Dwin M Craig

(57) ABSTRACT

A device for sensing at least one environmental condition in a data center. The device includes a chassis, a propelling mechanism, a power supply, a steering mechanism, and a controller supported on the chassis. The chassis also supports at least one environmental condition sensor and is operable to travel through the data center and sense at least one environmental condition at various locations throughout the data center.

22 Claims, 12 Drawing Sheets

U.S. PATENT DOCUMENTS

| | | |
|---|---|---|
| 6,489,793 B2 | 12/2002 | Jones et al. |
| 6,560,980 B2 | 5/2003 | Gustafson et al. |
| 6,637,266 B1 | 10/2003 | Froom |
| 6,719,625 B2 | 4/2004 | Federspiel |
| 6,760,645 B2 * | 7/2004 | Kaplan et al. ............... 700/245 |
| 6,917,893 B2 | 7/2005 | Dietsch et al. |
| 6,968,707 B2 | 11/2005 | Violand et al. |
| 7,062,930 B2 | 6/2006 | Rayburn |
| 7,114,555 B2 * | 10/2006 | Patel et al. ............... 165/247 |
| 7,225,864 B2 | 6/2007 | Jeong |
| 7,234,312 B2 | 6/2007 | Violand et al. |
| 2003/0033150 A1 | 2/2003 | Balan et al. |
| 2003/0176986 A1 | 9/2003 | Dietsch et al. |
| 2004/0076324 A1 | 4/2004 | Burl et al. |
| 2004/0243280 A1 | 12/2004 | Bash et al. |

\* cited by examiner

CONTROLLED COOLING OF A DATA CENTER

CLAIM FOR PRIORITY

This application is a divisional application of U.S. patent application Ser. No. 11/503,654, filed on Aug. 14, 2006, now abandoned which is a Divisional Application of U.S. patent application Ser. No. 10/157,892, filed on May 31, 2002, which has matured into U.S. Pat. No. 7,114,555, the disclosures of which are hereby incorporated by reference in their entireties.

CROSS-REFERENCE

The present invention is related to pending U.S. application Ser. No. 09/970,707, filed Oct. 5, 2001, and entitled "SMART COOLING OF DATA CENTERS", by Patel et al., which is assigned to the assignee of the present invention and is incorporated by reference herein in its entirety.

FIELD OF THE INVENTION

This invention relates generally to cooling systems. More particularly, the invention pertains to a system for delivering controlled cooling in a data center.

BACKGROUND OF THE INVENTION

A data center may be defined as a location, e.g., room, that houses computer systems arranged in a number of racks. A standard rack may be defined as an Electronics Industry Association (EIA) enclosure, 78 in. (2 meters) wide, 24 in. (0.61 meter) wide and 30 in. (0.76 meter) deep. Standard racks may be configured to house a number of computer systems, e.g., about forty (40) systems, with future configurations of racks being designed to accommodate up to eighty (80) systems. The computer systems typically include a number of components, e.g., one or more of a PCB, mass storage devices, power supplies, processors, micro-controllers, semi-conductor devices, and the like, that may dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, refrigerant, etc., across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more air conditioning units. The compressors of the air conditioning units typically require a minimum of about thirty (30) percent of the required operating energy to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. That is, cooling fluid is supplied to the components at around 100 percent of the estimated cooling requirement. In this respect, conventional cooling systems often attempt to cool components that may not be operating at a level which may cause its temperature to exceed a predetermined temperature range. Consequently, conventional cooling systems often incur greater amounts of operating expenses than may be necessary to sufficiently cool the heat generating components contained in the racks of data centers.

Another problem associated with the cooling of data centers involves the expense and difficulty in measuring the environmental conditions, e.g., temperature, humidity, air flow, etc., within and around the racks. Although it has been found that the use of temperature sensors, e.g., thermocouples, located at various locations throughout the data center has been a relatively accurate manner of detecting temperatures, this practice has also been found to be relatively restrictive due to the difficulty and costs associated with this implementation. By way of example, the number of sensors required to detect the environmental conditions throughout the data center may require that a substantially inordinate number of sensors be implemented.

SUMMARY OF THE INVENTION

According to one embodiment, the present invention pertains to a device having means for propelling, means for navigating, means for controlling the propelling means and the navigating means to move said device to sense at least one environmental condition, and means for transmitting the at least one environmental condition sensed by the sensing means.

According to another embodiment, the invention relates to a device for sensing at least one environmental condition in a data center. The device includes a chassis, a propelling mechanism, a power supply, a steering mechanism, and a controller supported on the chassis. The chassis also supports at least one environmental condition sensor and is operable to travel through the data center and sense at least one environmental condition at various locations throughout the data center.

According to yet another embodiment, the present invention pertains to a system for cooling components in a data center. The system includes an environmental condition sensing device configured to travel through the data center. The system also includes a cooling device for supplying cooling fluid to the components. The cooling device includes a variable output fan, a plenum having an inlet and a plurality of outlets. The inlet of the plenum is in fluid communication with the fan and the plurality of outlets are in fluid communication with a plurality of vents for delivering the cooling fluid to the components. The vents are operable to vary a characteristic of the cooling fluid delivered through each of the vents in response to environmental data transmitted from the environmental condition sensing device.

According to yet another embodiment, the present invention relates to a method for operating a device to detect at least one environmental condition in a data center. In the method, a route is plotted for the device and the device is maneuvered along the route. In addition, at least one environmental condition is detected in the data center by the device.

According to a further embodiment, the invention pertains to a method of cooling a plurality of components in a data center. In the method, a cooling system is activated and a plurality of vents are opened. Each of the plurality of vents is configured to supply cooling fluid to at least one of the plurality of components. The temperatures in areas around the plurality of components are sensed and temperatures from a movable device configured to detect at least one environmental condition at various locations of the data center are received. In addition, it is determined whether at least one of the sensed temperatures and the received temperatures are within a predetermined temperature range. Moreover, at least one of the supply of the cooling fluid to the components and the temperature of the cooling fluid is controlled in response to at least one of the sensed and received temperatures being outside of the predetermined temperature range.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1A:
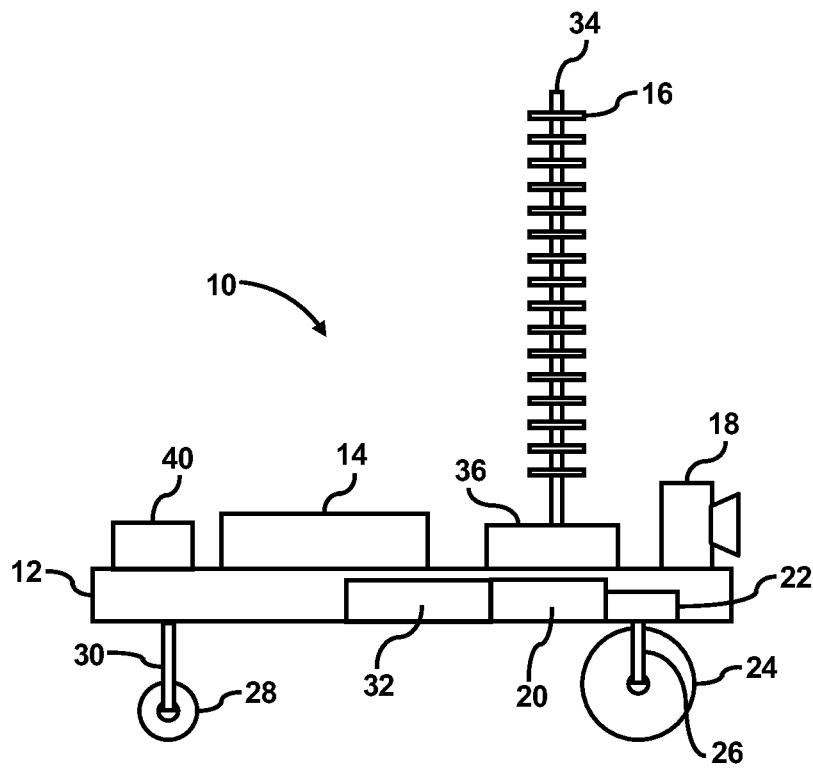
FIG. 1A shows a simplified schematic side plan view of a device according to an embodiment of the invention.

For simplicity and illustrative purposes, the principles of the present invention are described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structure have not been described in detail so as not to unnecessarily obscure the present invention.

According to an embodiment of the present invention, a cooling system may be configured to adjust cooling fluid, e.g., air, gas, refrigerant, etc., flow to various racks located throughout a data center, e.g., location that houses numerous printed circuit (PC) board electronic systems arranged in a number of racks, based upon the detected or anticipated temperatures at various locations throughout the data center. In addition, the cooling system may be configured to vary the temperature of the cooling fluid supply.

It should be understood that any reasonably suitable type of cooling system designed to circulate cooling fluid throughout a room may be implemented in accordance with the above-described embodiment. Some suitable cooling systems may include those that implement air conditioners, heat exchangers, heat pumps, and the like.

In one respect, by substantially increasing the cooling fluid flow to those racks dissipating greater amounts of heat and by substantially decreasing the cooling fluid flow to those racks dissipating lesser amounts of heat. In addition to adjusting the temperature of the cooling fluid supply, the amount of energy required to operate the cooling system may be relatively reduced. Thus, instead of operating the devices, e.g., compressors, heat exchangers, fans, etc., of the cooling system at substantially 100 percent of the anticipated heat dissipation from the racks, those devices may be operated according to the actual cooling needs. In addition, the racks may be positioned throughout the data center according to their anticipated heat loads to thereby enable computer room air conditioning (CRAC) units located at various positions throughout the data center to operate in a more efficient manner.

In another respect, the positioning of the racks may be determined through implementation of numerical modeling and metrology of the cooling fluid flow throughout the data center. In addition, the numerical modeling may be implemented to determine the volume flow rate and velocity of the cooling fluid flow through each of the vents.

A more detailed description of the above-described embodiment may be found in co-pending U.S. application Ser. No. 09/970,707, filed Oct. 5, 2001, which is assigned to the assignee of the present invention and is incorporated by reference herein in its entirety.

According to another embodiment of the invention, a device is implemented to gather or measure at least one local environmental condition (e.g., temperature, air flow, humidity, etc.) in the data center. More particularly, the device is configured to travel around the racks to determine the one or more environmental conditions at various locations throughout the data center. In addition, the device may be configured to detect the one or more environmental conditions at various heights throughout the data center. The information gathered by the device may be transmitted to a data center controller. The data center controller may vary the delivery and temperature of cooling fluid according to the one or more detected environmental conditions. In this respect, the energy necessary to cool the racks and the components contained therein, may substantially be optimized.

FIG. 1A shows a simplified schematic side plan view of a device 10 according to an embodiment of the invention. The device 10 includes a chassis 12 configured to support a device controller 14, a plurality of sensors 16, and a guidance sensor 18. The chassis 12 may also support a propelling mechanism 20, e.g., a direct current (DC) motor, an alternating current (AC) motor, or the like, and a transmission mechanism 22 designed to transmit power created by the propelling mechanism 20 to at least one wheel 24 through shaft(s) 26. The chassis 12 may further support two or more wheels 24, 28 through respective shafts 26, 30. The two or more wheels 24 and 28 may be configured to rotate upon receipt of instructions by the device controller 14 to thereby propel the device 10. In addition, a motor (not shown) may be operable to cause at least one of the shafts 26 and 30 to rotate to thereby vary the direction of device 10 travel.

The guidance sensor 18 may comprise any reasonably suitable apparatus operable to detect the location and distance of objects relative to the guidance sensor 18. Suitable apparatus may include optical sensors (e.g., laser systems), acoustic sensors (e.g., sonar systems), and like sensors. The guidance sensor 18 may be implemented to enable the device 10 to travel through a data center without substantial interference. In this respect, the guidance sensor 18 may send signals to the device controller 14 to control the direction and speed of travel of the device 10 through the data center.

A power supply 32 may also be provided on the chassis 12. The power supply 32 may be configured to deliver power to operate the propelling mechanism 20 to thereby enable the device 10 to travel through the data center. The power supply 32 may comprise a rechargeable and/or replaceable battery. Alternatively, the propelling mechanism 20 may be powered through an AC connection, e.g., through a track located along the device's 10 route.

The sensors 16 may be attached to a pole 34 that extends generally perpendicularly from a main plane of the chassis 12. The pole 34 may extend to any reasonably suitable height to enable the measurement of the one or more conditions at various heights with respect to the racks contained in a data center (e.g., between about 2.5-6.5 feet). The pole 34 may be attached to the chassis 12 through a pole base 36 in any reasonably suitable manner, e.g., welds, mechanical fasteners, adhesive, and the like. The pole base 36 may provide both structural support for the pole 34 and a means for enabling communications between the sensors 16 and the device controller 14. By way of example, the pole base 36 may function as a conduit enabling data related to the one or more conditions detected by the sensors 16 to be relayed to the device controller 14.

The pole 34 may be telescopic to extend to various heights and measure the one or more environmental conditions at various locations. The pole 34 may also be configured to retract, for example, when the device 10 is in an idle state. In addition, the pole 34 may be attached to the chassis 12 through a movable joint that enables the pole 34 to rotate or obtain various angles with respect to the chassis 12. Moreover, the pole 34 may be deployed from the chassis 12 such that it extends generally horizontally or at various angles. In this respect, a relatively fewer number of sensors 16 may be required to adequately detect the one or more environmental conditions at various locations throughout a data center.

Each of the sensors 16 may be positioned along the pole 34 to detect various environmental conditions at various heights. In this respect, the sensors 16 may comprise temperature sensors, air flow sensors, humidity sensors, and the like. In addition, the sensors 16 may be configured to detect combinations of these environmental conditions. Hence, some of the sensors 16 may detect temperature, whereas certain others of the sensors 16 may detect air flow. An air flow sensor generally refers to a sensor designed to detect the direction and magnitude of air flow around the sensor. It should be understood that any reasonably suitable commercially available sensors may be implemented with the device 10. It should also be understood that the device 10 may include a single sensor 16 configured to detect one or more environmental conditions without departing from the scope of the invention.

The data related to the detected environmental conditions by the sensors 16 may be relayed to a data logging device 40, which may also be supported by the chassis 12. The data logging device 40 may comprise any reasonably suitable data receiving and transmitting device, e.g., a laptop computer having a remote transmission means. In this regard, the data logging device 40 may be configured to run a program to process the environmental conditions. The processed environmental conditions may then be relayed to a data center controller (not shown). The data logging device 40 may also evaluate the data to determine, for example, whether a detected hot spot is local or zonal. By way of example, the device 10 may travel through a data center and collect data pertaining to the temperature of the cooling fluid at locations along its path. The collected data may be processed and evaluated by the data logging device 40 to determine whether the delivery of cooling fluid should be increased, sustained, or decreased at various locations of the data center. This information may then be transmitted to the data center controller.

In addition, the data logging device 40 may transmit information pertaining to how and to what degree the cooling fluid delivery should be varied to the data center controller such that the cooling fluid flow to the desired areas may be varied. In this respect, the data logging device 40 may also determine the manner in which the cooling fluid delivery should be varied (e.g., one or more of fluid flow direction and magnitude around respective racks and/or the cooling fluid temperature). By way of example, the data logging device 40 may determine how the fluid flow through a specific vent should be actuated and transmit this information to the data center controller. The data center controller may then utilize this information to actuate the vent.

It should be understood that the functions of the data logging device 40 and the device controller 14 may be implemented by a single control apparatus without departing from the scope of the invention.

Alternatively, the data collected by the sensors 16 and stored in the data logging device 40 may be relayed to the data center controller prior to processing of the data. In this instance, the data center controller may process and evaluate the data received from the data logging device 40.

The device controller 14 may comprise a computer configured to control the operations of the device 10. The device controller 14 may thus comprise a memory (not shown) and a processor (not shown). The memory may contain one or more algorithms configured to control the motion of the vehicle, e.g., direction, velocity, route, etc., which the processor may access in controlling the vehicle's motion. In addition, the processor may receive input from the guidance sensor 18. A more detailed description of the manner in which the device controller 14 may operate is provided hereinbelow with respect to FIG. 2.

It should be understood that the device 10 may include additional components and that some of the above-described components may be removed and/or modified without departing from the scope and spirit of the invention.

Figure 1B:
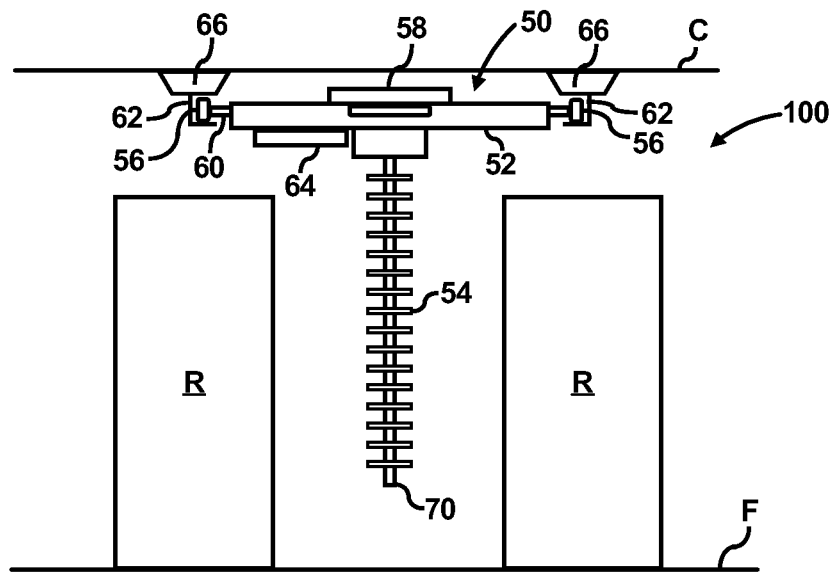
FIG. 1B is a simplified schematic side plan view of an exemplary device and a sectional view of a data center according to another embodiment of the invention.

FIG. 1B is a simplified schematic side plan view of a device 50 and a sectional view of a data center 100 according to another embodiment of the invention. According to this embodiment, the device 50 may be suspended on the ceiling (C) above the floor (F) of a data center 100. In this respect, the device 50 may maneuver between the racks (R) without substantial interference from debris and other objects that may be present on the floor (F).

The device 50 generally includes a chassis 52 configured to support a plurality of sensors 54 and a drive mechanism. The drive mechanism includes a device controller 64, at least two wheels 56, and a propelling mechanism 58 (e.g., a DC motor, an AC motor, or the like). The device controller 64 may comprise a computer, e.g., a processor, a memory, etc., configured to control the motion of the device 50. By way of example, the memory may store one or more algorithms by which the device controller 64 may control the direction and speed of the device's 50 travel. Although not illustrated in FIG. 1B, the device 50 may include a guidance sensor configured to enable the device 50 to avoid obstacles that may be present along its path of travel.

The propelling mechanism 58 may be connected to an axle 60 designed to cause the wheels 56 to rotate. The wheels 56 may be supported on a pair of tracks 62 that may comprise generally L-shaped or C-shaped configurations. The tracks 62 may directly be connected to the ceiling (C). Alternatively, as illustrated in FIG. 1B, the tracks 62 may be attached to pairs of cable trays 66. The cable trays 66 may extend over the racks (R) and function as conduits for supplying communication and power lines to each of the racks. Although the propelling mechanism 58 is illustrated as being configured to rotate wheels 56, it should be understood that other reasonably suitable systems may be implemented to cause the device 50 to translate. For example, a belt or chain system may be attached to the device 50 with a motor positioned separately from the device 50.

In a similar fashion to that described hereinabove with respect to the sensors 16, the sensors 54 may sense environmental conditions around the racks (R). In this regard, the sensors 54 may comprise temperature sensors, air flow sensors, humidity sensors, and the like. Additionally, the sensors 54 may communicate with a data-logging device (not shown) configured to store and transmit the sensed data to, for example, a data center controller (not shown). Moreover, the pole 70 upon which the sensors 54 are mounted may be maneuvered and manipulated in the manners described above with respect to the pole 34. A more detailed description of the manner in which the sensed data may be stored and transmitted is provided hereinbelow with respect to FIG. 2.

It should be understood that the device 50 may include additional components and that some of the above-described components may be removed and/or modified without departing from the scope and spirit of the invention.

Figure 1C:
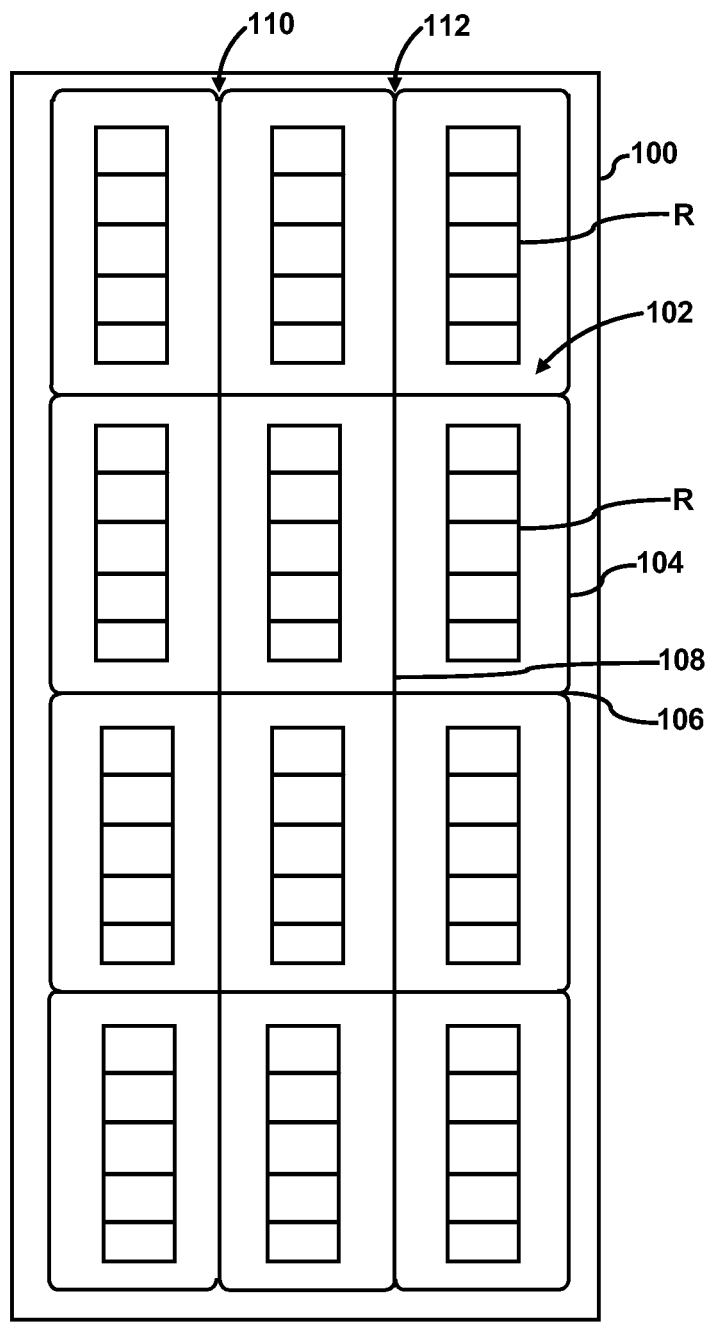
FIG. 1C is a simplified top plan view of a data center having a plurality of racks in accordance with an embodiment of the invention.

FIG. 1C is a simplified top plan view of a data center 100 having a plurality of racks (R). Each of the racks (R) may comprise one or more racks and each of the racks (R) may be separated from each other and the walls of the data center 100 to create spaces 102 through which a device, e.g., device 10, 50, may pass. Illustrated in the spaces 102 are lines 104 which indicate a path the device 10, 50 may travel. As illustrated, the device 10, 50 may travel between each of the racks (R) or groups of racks (R) to detect one or more environmental conditions existing around the racks (R). Although the lines 104 are illustrated as being substantially equally spaced from the racks (R), it should be understood that the device 10, 50 may be configured to detect the one or more environmental conditions at locations that are relatively nearer or farther to the racks (R). This may be accomplished by either moving the device 10, 50 to a physically nearer or farther location, or it may be accomplished by moving, e.g., extending, angling, and the like, the pole 34, 70.

It should also be understood that any reasonably suitable number of devices 10, 50 may be implemented in the data center 100 to sense the environmental condition(s) around the one or more racks (R). In this regard, if a plurality of devices, e.g., 10, are implemented, one or more of the devices may operate simultaneously to thus detect the environmental condition(s) at more than one location. In addition, one or more devices may operate while one or more other devices undergo a charging operation.

The lines 104 may also signify tracks along the floor of the data center 100 upon which the device 10 (FIG. 1A) may travel. The tracks may comprise, for example, rails into which the wheels 24 may be engaged to thereby limit and control the travel of the device 10. In addition, the tracks may provide a means for supplying power to the device 10 as well as communications between the device 10 and a data center controller (not shown). Alternatively, the line 104 may comprise a signal line to which the device 10 may either physically or remotely be attached. In this respect, the line 104 may signify, for example, a wire embedded in the floor which the device 10, 50 may detect to determine its path through the data center 100.

The lines 104 may further signify the tracks 62 illustrated in FIG. 1B. The tracks 62 may be located throughout the data center 100 to enable the device 50 to travel to various locations within the data center 100. In this respect, a plurality of junctions 106, 108 between the lines 104 may be provided to enable the device 50 to travel to the various locations. Alternatively, a plurality of devices 50 may be provided to travel through respective passages 110, 112. In this respect, junctions 106 and 108 may be unnecessary, as the devices 50 may only be required to travel through a single passage 110, 112.

The lines 104 may further function as power and communication lines for the devices 10, 50. By way of example, although not specifically illustrated in FIG. 1C, the devices 10, 50 may be operable to receive power from a remote source through the lines 104. In addition, the devices 10, 50 may be configured to receive and transmit data to a remote location (e.g., a remotely located computer, a data center controller, etc.). In this respect, the devices 10, 50 may be configured with a relatively small number of components to thereby relatively reduce their weights. By virtue of this configuration, the amount of power required to maneuver the devices 10, 50 may be reduced.

Figure 2:
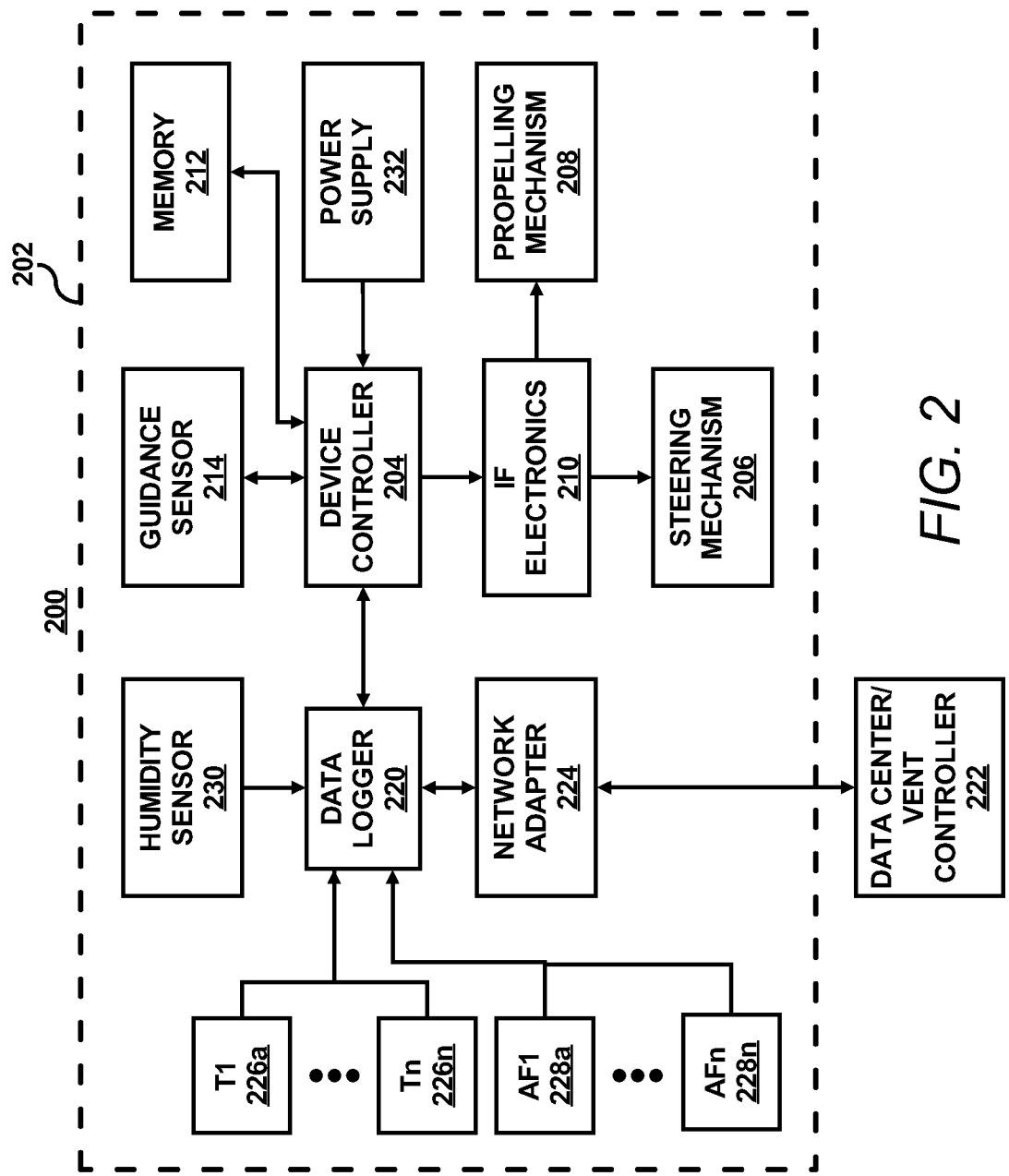
FIG. 2 is an exemplary block diagram for a device according to an embodiment of the invention.

Referring to FIG. 2, there is illustrated a block diagram 200 for a device 202 according to an embodiment of the present invention. It should be understood that the following description of the block diagram 200 is but one manner of a variety of different manners in which such a device 202 may be operated. In addition, it should be understood that the device 202 may include additional components and that some of the components described may be removed and/or modified without departing from the scope of the invention.

The device 202 includes a device controller 204 configured to control the device 202 operations. The device controller 204 may comprise a microprocessor, a micro-controller, an application specific integrated circuit (ASIC), and the like. The device controller 204 may, for example, control the steering mechanism 206 and the propelling mechanism 208 to manipulate the device 202. Interface electronics 210 may be provided to act as an interface between the device controller 204 and the steering mechanism 206 and the propelling mechanism 208, e.g., control the degree of rotation of the shafts connected to the wheels, control the speed at which the wheels are rotated, etc. The device controller 204 may further include a power supply 232 for supplying power for operation of the device 202 components.

The device controller 204 may be interfaced with a memory 212 configured to provide storage of a computer software that provides the functionality of the device 202, e.g., steering mechanism 206 and propelling mechanism 208, and may be executed by the device controller 204. The memory 212 may be implemented as a combination of volatile and non-volatile memory, such as dynamic random access memory (DRAM), EEPROM, flash memory, and the like. The memory 212 may also be configured to provide a storage for containing data and/or information pertaining to the manner in which device controller 204 may operate the steering mechanism 206 and the propelling mechanism 208 in response to, for example, objects detected along its path by a guidance sensor 214 (e.g., which may comprise any of the sensors described hereinabove with respect to the guidance sensor 18). By way of example, the device controller 204 may manipulate the steering mechanism 206 and the propelling mechanism 208 to generally avoid objects along its path. In addition, the device controller 204 may operate to set an alternate course based upon the location of detected objects. The alternate course may be formulated based upon, for example, the shortest route between the device's 202 current location and an intended destination.

The device controller 204 may be interfaced with a data logger 220 configured to receive information from a plurality of sensors. As an alternative, the device controller 204 and the data logger 220 may be composed of a single computing apparatus that is capable of performing the functions of both the device controller and the data logger 220. As another alternative, the data logger 220 may "stand-alone" with respect to the device controller 204. In this regard, the data logger may operate without direction or input from the device controller 204.

The data logger 220 may comprise any reasonably suitable data receiving and transmitting device, e.g., a laptop computer, a processor and a memory, and the like. The data logger 220 may be configured to transmit data received from the plurality of sensors to a data center/vent controller 222. The data may be transmitted through implementation of a network adapter 224, e.g., an interface that enables communication between the data logger 220 and the data center/vent controller 222. The network adapter 224 may enable at least one of a wired connection or a wireless connection.

The network adapter 224 may also enable communication between the device controller 204 and the data center/vent controller 222. In this respect, information from the data center/vent controller 222 may be transmitted to the device controller 204. By way of example, information related to the location of detected hot spots may be transmitted to the device controller 204. The communication between the data center/vent controller 222 and the device controller 204 may be effectuated by a wired protocol, such as IEEE 802.3, etc., wireless protocols, such as IEEE 801.11b, wireless serial connection, Bluetooth, etc., or combinations thereof.

The data logger 220 may be in communication with a plurality of sensors, e.g., temperature (T) sensors 226a-226n, air flow (AF) sensors 228a-228n, and a humidity sensor 230. The sensors 226a-226n, 228a-228n 230 may be located at various heights along a sense pole 34 as illustrated in FIGS. 1A and 1B. In this respect, the sensors 226a-226n, 228a-228n, and 230 may comprise the sensors 16, 54 illustrated in FIGS. 1A and 1B.

The sensors 226a-226n, 228a-228n, and 230 may be configured to transmit sensed information to the data logger 220. The data logger 220 may compile the received information. For example, the data logger 220 may maintain a database of the temperatures at various heights and at various locations within a data center. The data logger 220 may evaluate the sensed information to determine a manner in which the cooling fluid supplied to various areas of the data center should be manipulated (e.g., one or more of fluid flow direction and magnitude around respective racks and/or the cooling fluid temperature). In this regard, the data logger 220 may determine the actuator settings, for example, for one or more of the vents. The data logger 220 may thus be capable of performing one or more evaluation routines to determine the actuator settings.

The evaluation routines may comprise a comparison of sensed information with information contained in a look up table (LUT) (not shown), simple correlations, probabilistic algorithms, genetic algorithms, and the like. If a LUT is implemented, the LUT may contain information indicating the manner in which certain vents may be manipulated according to the sensed information. Thus, for example, if the data logger 220 determines that the temperature in a relatively large area of the data center is above a predetermined temperature, the LUT may indicate that the temperature of the cooling fluid supplied by the cooling system may require reduction.

The data logger 220 may then transmit the information pertaining to how the one or more vents should be actuated to the data center/vent controller 222. The data center/vent controller 22 may then implement the manipulations indicated by the data logger 220.

Alternatively, the information received by the data logger 220 may be transmitted to the data center/vent controller 222 prior to processing and evaluation thereof. In this instance, the data center/vent controller 222 may perform the above-described evaluation routines to determine how the vents and/or cooling system should be manipulated in response to the sensed conditions. In addition, as described hereinbelow, the data center controller 222 may control the flow of cooling fluid to various locations throughout the data center according to the detected cooling needs.

As discussed in co-pending U.S. patent application Ser. No. 09/970,707, a cooling system is configured to adjust cooling fluid, e.g., air, gas, refrigerant, etc., flow to various racks located throughout a data center. In addition, the cooling system may also vary the temperature of the cooling fluid. In one respect, by substantially increasing the cooling fluid flow to those racks dissipating greater amounts of heat and by substantially decreasing the cooling fluid flow to those racks dissipating lesser amounts of heat, the amount of energy required to operate the cooling system may be relatively reduced. Moreover, the energy requirement may further be reduced by adjusting the cooling fluid temperature. Thus, instead of operating the devices, e.g., compressors, heat exchangers, fans, etc., of the cooling system at substantially 100 percent of the anticipated heat dissipation from the racks, those devices may be operated according to the detected cooling needs.

Figure 3:
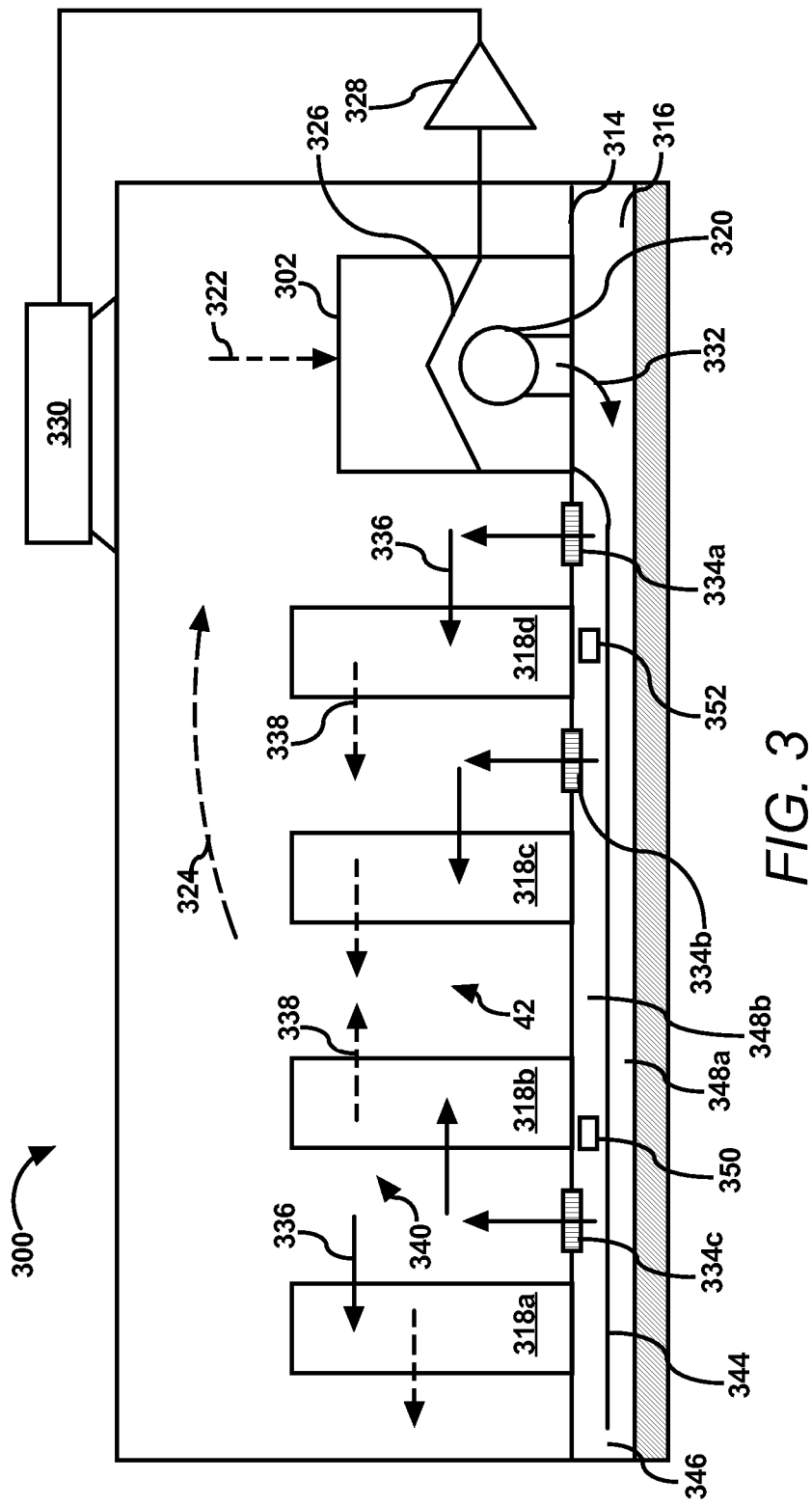
FIG. 3 shows a simplified schematic illustration of a data center containing a cooling system according to an embodiment of the invention.

FIG. 3 shows a simplified schematic illustration of a data center 300 containing a cooling system 302. The data center 300 includes a raised floor 314, with the space 316 located therebelow being designed to house a plurality of wires and communication lines (not shown). In addition, the space 316 may function as a plenum to deliver cooling fluid from the cooling system 302 to a plurality of racks 318a-318d. Although the data center 300 is illustrated in FIG. 1 as containing four racks 318a-318d and a cooling system 302, it should be understood that the data center 300 may include any number of racks, e.g., 100 racks, and cooling systems, e.g., four or more.

The racks 318a-318d may generally house a plurality of components (not shown), e.g., processors, micro-controllers, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, may dissipate relatively large amounts of heat. Because the racks 318a-318d have been generally known to include upwards of forty (40) or more subsystems, they may require substantially large amounts of cooling fluid to maintain the subsystems and the components generally within a predetermined operating temperature range. According to an embodiment of the invention, by substantially controlling the amount of cooling fluid delivered to the components and the subsystems located in the racks 318a-318d based upon their respective heat loads, the power consumed by the cooling system 302 to supply the cooling fluid may also be controlled.

The cooling system 302 generally includes a fan 320 for supplying cooling fluid into the space 316 (e.g., plenum). Air is supplied into the fan 320 from the heated air in the data center 300 as indicated by arrows 322 and 324. In operation, the heated air enters into the cooling system 302 as indicated by arrow 322 and is cooled by operation of a cooling coil 326, a compressor 328, and a condenser 330, in any reasonably suitable manner generally known to those of ordinary skill in the art. In addition, based upon the cooling fluid needed by the heat loads in the racks 318a-318d, the cooling system 302 may be operated at various levels. For example, the capacity (e.g., the amount of work exerted on the refrigerant) of the compressor 328 and the speed of the fan 320 may both be modified to thereby control the temperature and the amount of cooling fluid flow delivered to the racks 318a-318d. In this respect, the compressor 328 may be a variable capacity compressor and the fan 320 may be a variable speed fan. The compressor 328 may thus be controlled to either increase or decrease the mass flow rate of a refrigerant therethrough. Because the specific type of compressor 328 and fan 320 to be employed with embodiments of the invention may vary according to individual needs, the invention is not limited to any specific type of compressor or fan. Instead, any reasonably suitable type of compressor 328 and fan 320 that are capable of accomplishing certain aspects of the invention may be employed with the embodiments of the invention. The choice of compressor 328 and fan 320 may depend upon a plurality of factors, e.g., cooling requirements, costs, operating expenses, etc.

As an alternative to the compressor 328 illustrated in FIG. 3, a heat exchanger (not shown) may be implemented in the cooling system 302 to cool the fluid supply. The heat exchanger may comprise a chilled water heat exchanger, a centrifugal chiller (e.g., a chiller manufactured by YORK), and the like, that generally operates to cool air as it passes thereover. The heat exchanger may comprise a plurality of air conditioning units. The air condition units may be supplied with water driven by a pump and cooled by a condenser or a cooling tower. The heat exchanger capacity may be varied based upon heat dissipation demands. Thus, the heat exchanger capacity may be decreased where, for example, it is unnecessary to maintain the cooling fluid at a relatively low temperature.

It should be understood that the data center 300 illustrated in FIG. 3 may contain a plurality of cooling systems 302. By way of example, a relatively large data center may comprise three or more cooling systems 302 positioned at various locations around the data center. It should also be understood that the cooling systems may comprise at least one of a compressor 328 and a heat exchanger.

The cooling fluid generally flows from the fan 320 and into the space 316 (e.g., plenum) as indicated by the arrow 332. The cooling fluid flows out of the raised floor 314 through a plurality of dynamically controllable vents 334a-334c that generally operate to control the velocity and the volume flow rate of the cooling fluid therethrough. In one respect, the velocity and the volume flow rate of the cooling fluid may be regulated by varying the shape and/or opening size of the vents 334a-334c. Thus, the racks 318a-318d may receive substantially individualized and localized amounts of cooling fluid according to their heat loads. The arrows 336 indicate the general direction of travel of the cooling fluid and the dashed arrows 338 indicate the general direction of travel of fluid heated by the heat dissipating components located within the racks 318a-318d. As may be seen in FIG. 3, the areas between the racks 318a-318d may comprise either cool aisles 340 or hot aisles 342, or a combination thereof. The cool aisles 340 are those aisles that include the vents 336a-336c and thus receive cooling fluid for delivery to the racks 318a-318d. The hot aisles 342 are those aisles that receive air heated by the heat dissipating components in the racks 318a-318d.

In addition, various sections of each of the racks 318a-318d may also receive substantially individualized amounts of cooling fluid. By way of example, if the bottom halves of the racks 318a and 318b are operating at maximum power, thereby dissipating a maximum level of heat load, and the upper halves are operating at little or no power, the vent 334c may be configured to enable cooling fluid flow therethrough to have a relatively high volume flow rate with a relatively low velocity. In this manner, the cooling fluid may operate to generally supply greater cooling to the lower halves of the racks 318a and 318b, whereas the upper halves receive relatively lesser amounts of cooling fluid. In addition, if the upper halves of the racks 318c and 318d are operating at approximately 50 percent of their maximum power, and the lower halves are operating at little or no power, the vent 334b may be configured to enable cooling fluid flow therethrough to have a relatively low volume flow rate with a relatively high velocity. In this manner, the cooling fluid flow may have sufficient momentum to adequately reach and cool the upper halves of the racks 318c and 318d.

Moreover, as the cooling requirements vary according to the heat loads in the racks 318a-318d, and the subsequent variations in the volume flow rate of the cooling fluid, the cooling system 302 may also vary the amount of cooling fluid supplied to the racks. As an example, if the heat load in the racks 318a-318d generally increases, the cooling system 302 may operate to increase the supply and/or decrease the temperature of the cooling fluid. Alternatively, if the heat load in the racks 318a-318d generally decreases, the cooling system 302 may operate to decrease the supply and/or increase the temperature of the cooling fluid. The vents 334a-334c thus generally provide localized control of the cooling fluid flow to the racks 318a-318d and the cooling system 302 generally provides global control of the cooling fluid flow and temperature. In one respect, therefore, the amount of energy consumed by the cooling system 302 in maintaining the racks 318a-318d at within a predetermined temperature range may be substantially reduced in comparison with conventional data center cooling systems.

According to an embodiment of the present invention, the cooling fluid supply for flow through each of the vents 334a-334c may be maintained at a relatively uniform pressure. In this respect, the space 316 may include a divider 344. The divider 344 may extend substantially along the entire length of space 316, i.e., in the direction generally perpendicular to the plane of FIG. 3. The divider 344 may also extend from the cooling system 312 to substantially the end of the space 316 to thus create a gap 346 between a side edge of the divider and a side surface of the space. The divider 344 generally divides the space 316 into two relatively separate chambers 348a and 348b. The first chamber 348a is in fluid communication with the outlet of the fan 320. The second chamber 348b is in fluid communication with the first chamber 348b substantially through the gap 46. In this respect, the cooling fluid flow originating from the fan 320 must travel substantially the entire width of the space 316, i.e., through the first chamber 348a, for the fluid flow to enter into the second chamber 348b.

The cooling fluid in the second chamber 348b may be maintained at a substantially uniform static pressure by virtue of the manner in which the cooling fluid is introduced into the second chamber 348b. The rate at which the cooling fluid is supplied into the first chamber 348a by the fan 320 may cause a relatively large amount of turbulence in the cooling fluid located in the first chamber 348a. The turbulence is generally greatest at the outlet of the fan 320 and generally decreases as the distance from the outlet increases. By virtue of the distance the cooling fluid must travel to enter into the second chamber 348b, the cooling fluid may have substantially stabilized, thus enabling the cooling fluid entering into the second chamber 348b to be relatively calm. In this respect, the divider 344 operates to provide a relatively consistent cooling fluid pressure supply for the vents 334a-334c.

The pressure of the cooling fluid located in the second chamber 348b may be measured by a pressure sensor 350. In this respect, the pressure sensor 350 may detect any discernable changes in the pressure of the cooling fluid located within the second chamber 348b and relay that information to a data center controller (not shown). The data center controller may operate to alter the output of the fan 320 in response to the detected changes in pressure. Therefore, operation of the fan 320 may be related to the cooling requirements of the racks 318a-318d and the amount of energy required to supply the racks 318a-318d with cooling fluid may be substantially optimized. In one respect, only that amount of energy required to substantially cool the components contained in the racks 318a-318d may be expended, which may correlate to a substantial energy savings over known cooling systems.

The capacity of the compressor 328 may vary according to changes in the temperature of the cooling fluid located in the second chamber 348b. Alternatively, if a heat exchanger is implemented in the cooling system 302, the capacity of the heat exchanger may be varied. As such, a plenum temperature sensor 352 may be located within the second chamber 348b to relay temperature measurements to the cooling system 302. The plenum temperature sensor 352 may comprise any reasonably suitable temperature sensor known to those skilled in the art. Therefore, the compressor 328 and/or heat exchanger may be operated to generally adjust the temperature of the cooling fluid within the second chamber 348b to desired levels. In addition, the capacity of the compressor 328 and/or heat exchanger may also vary according to detected and/or anticipated changes in heat loads generated in the racks 318a-318d. As an example, the compressor 328 and/or heat exchanger capacity may be increased as the heat loads generated in the racks 318a-318d increase. In this regard, the power required to operate the compressor 328 and/or heat exchanger may be substantially optimized, thereby reducing the total power required to operate the cooling system 302.

Figure 4A:
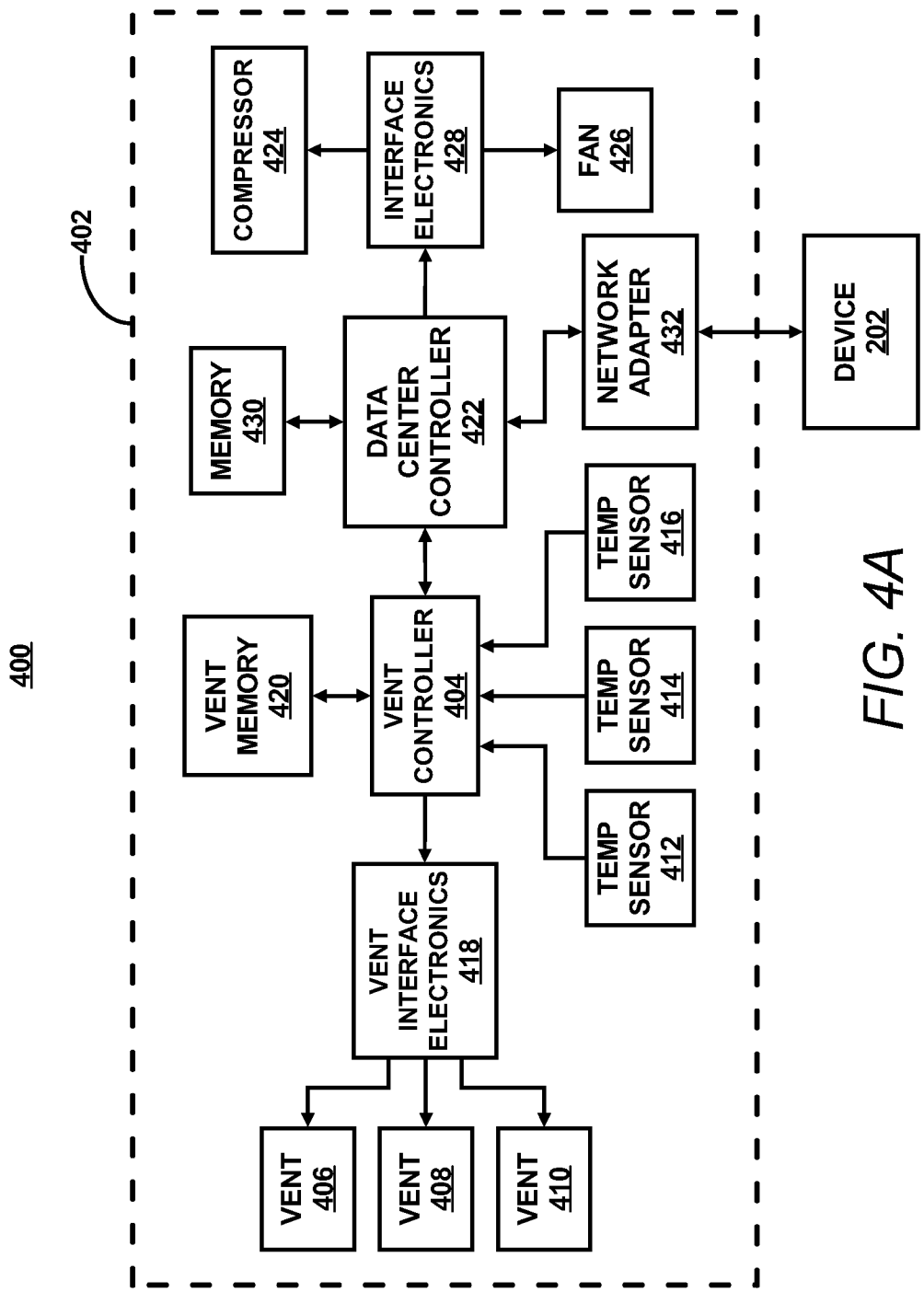
FIG. 4A illustrates an exemplary block diagram for a cooling system according to an embodiment of the invention.

Referring to FIG. 4A, there is illustrated a block diagram 400 for a cooling system 402 according to an embodiment of the invention. The following description of the block diagram 400 is one manner in which the cooling system 402 may be operated to cool a data center, e.g., data center 300 illustrated in FIG. 3. It should thus be understood that the block diagram 400 may include additional components and that some of the above-described components may be removed and/or modified without departing from the scope and spirit of the invention.

A vent controller 404 is generally configured to control the operation of the vents 406-410, e.g., vents 334a-334c illustrated in FIG. 3. In this regard, the vent controller 404 may comprise a microprocessor, a micro-controller, an application specific integrated circuit (ASIC), or the like. The manner in which the vent controller 404 operates the vents 406-410, i.e., the flow of cooling fluid therethrough, may be predicated upon the detected or anticipated temperatures of the racks, e.g., racks 318a-318d, or portions thereof. For example, with regard to detected temperatures, a plurality of temperature sensors 412-416, e.g., thermocouples, may be positioned at various positions around the subsystems and/or the racks 318a-318d. Each of the temperature sensors 412-416 may correspond to a respective one of the vents 406-410. By way of example, one temperature sensor 412 may affect the flow of cooling fluid flow through one vent 406.

Alternatively, with regard to anticipated temperatures, anticipated cooling requirements for each of the racks 318a-318d and/or various sections of the racks may be predicated upon an impending load on the racks 318a-318d and/or sections of the racks. For example, the vent controller 404 may be connected to another controller, e.g., a central controller for the subsystems, which anticipates the heat load the components and/or the subsystems will dissipate. This information may be relayed to the vent controller 404 which may then manipulate the vents 406-410 according to the anticipated load.

Although FIG. 4A illustrates three temperature sensors 412-416, it should be understood that the number of temperature sensors is not critical to the operation of the exemplary embodiment of the invention. Instead, the cooling system 402 may include any reasonably suitable number of temperature sensors to thus measure the temperatures of any reasonably suitable number of racks 318a-318d or portions thereof. The number of temperature sensors and the temperature measurements of the number of racks may be upgradable, e.g., scalable, to include any additional components and/or racks that may be included in the data center.

Vent interface electronics 418 may act as an interface between the vent controller 404 and the components, e.g., control the opening in the vents and the direction of cooling fluid flow through the vents, etc, for operating the vents 406-410.

The vent controller 404 may also be interfaced with a vent memory 420 configured to provide storage of a computer software that provides the functionality of the cooling system and may be executed by the vent controller. The memory 420 may also be configured to provide a storage for containing data/information pertaining to the manner in which each of the vents 406-410 may be manipulated in response to the detected and/or anticipated temperatures of the portions of the racks 318a-318d.

In keeping with the example cited hereinabove, the vent controller 404 may operate the vent 406 to increase the volume flow rate and decrease the velocity of the cooling fluid flowing therethrough in response to a detected increase in the heat load of a lower portion of a corresponding rack. The memory 420 may be implemented as a combination of volatile and non-volatile memory, such as DRAM, EEPROM, flash memory, and the like.

If there is an actual detected change or an anticipated change in the temperature of the respective racks 318a-318d and/or portions thereof, the vent controller 404 may operate to manipulate the corresponding vent 406-410 to compensate, i.e., changes the volume flow rate, velocity, and other similar characteristics of the cooling fluid, for the change in temperature. In this respect, each of the racks 318a-318d and/or portions thereof generally receives substantially only the amount of cooling fluid necessary to maintain the temperature of the portions of the racks within a predetermined temperature range. In addition, the cooling fluid temperature may also be controlled as needed to substantially optimize cooling of the racks 318a-318d. As will be seen from the discussion hereinbelow, by controlling the cooling fluid flow in this manner, compressors 428 and/or heat exchangers, and fans 426 or various air conditioning units may be operated at substantially optimized levels, thereby decreasing the amount of energy and thus the operating costs required to operate these devices.

The vent controller 404 may be configured to relay data/information pertaining to the flow of cooling fluid through the vents 406-410 to a data center controller 422. The data center controller 422 is generally configured to control the operation of the cooling system 302, e.g., the compressor 424 and/or heat exchanger, and the fan 426. In this regard, the controller 422 may comprise a microprocessor, a micro-controller, ASIC, and the like. In addition, the data center controller 422 may be configured to relay data/information to the vent controller 404 to vary the cooling fluid distribution through the vents 406-410.

Interface electronics 428 may be provided to act as an interface between the data center controller 422 and the components for operating the compressor 424 and the fan 426, e.g., the supply of voltage to vary the respective speeds of the compressor and the fan, direct control of the compressor and the fan, control of the heat exchanger capacity, etc.

The data center controller 422 may also be interfaced with a memory 430 configured to provide storage of a computer software that provides the functionality of the cooling system 302, e.g., compressor 424 (heat exchanger) and fan 426, and may be executed by the data center controller 422. The memory 430 may also be configured to provide a storage for containing data/information pertaining to the manner in which the compressor 424 (heat exchanger) and the fan 426 may be manipulated in response to variations in the cooling fluid flow through the vents 406-410.

In keeping with the example cited hereinabove, the data center controller 422 may operate the compressor 424 (heat exchanger) to vary the cooling fluid temperature and the fan 426 to vary the volume flow rate of the cooling fluid flow in response to various degrees of detected increases/decreases in the volume flow rate through the vents 406-410. More particularly, a look up table (not shown) may be stored in the memory 430. By way of example, the look up table may include information pertaining to the level of compressor 424 speed (heat exchanger capacity) and fan 426 output increase necessary for a detected increase in the volume flow rate. In this respect, the compressor 424 speed (heat exchanger capacity) and the fan 426 output may be varied substantially incrementally in response to detected changes in the volume flow rate. The memory 430 may be implemented as a combination of volatile and non-volatile memory, such as DRAM, EEPROM, flash memory, and the like.

The data center controller 422 may be interfaced with a device controller and/or a data logger of a device, e.g., device controller 204 and/or data logger 220 of device 202 illustrated in FIG. 2. The interface may be executed through a network adapter 432. The network adapter 432 may enable communication between the data center controller 422 and the device controller 204 and/or the data logger 220 of the device 202. In this respect, information from the data center controller 422 may be transmitted to the device controller 204. In addition, information may be transmitted from the data logger 220 to the data center controller 422. By way of example, information related to the location of hot spots detected by the temperature sensors 412-416 may be transmitted to the device controller 204. Moreover, information from the data logger 220 obtained from the sensors 206a-230 may be transmitted to the data center controller 422. The communication between the data center controller 422 and the device controller 204 and/or the data logger 220 may be effectuated by a wired protocol, such as IEEE 802.3, etc., wireless protocols, such as IEEE 801.11b, wireless serial link, Bluetooth, etc., or combinations thereof.

The data center controller 422 may also communicate with the device 202 to instruct the device 202 to follow predetermined routes and/or to deviate from a planned route, for instance, to travel to a detected hot spot. Hot spots may not necessarily correspond in exact location to any given temperature sensor, but may be located between various temperature sensors. Therefore, the device 202 may be instructed to travel to a detected hot spot location to detect a more accurate location of the detected hot spot, in both latitudinal and longitudinal coordinates. In this respect, a relatively fewer number temperature sensors may be employed without a substantial reduction in the effectiveness of the cooling arrangement.

Figure 4B:
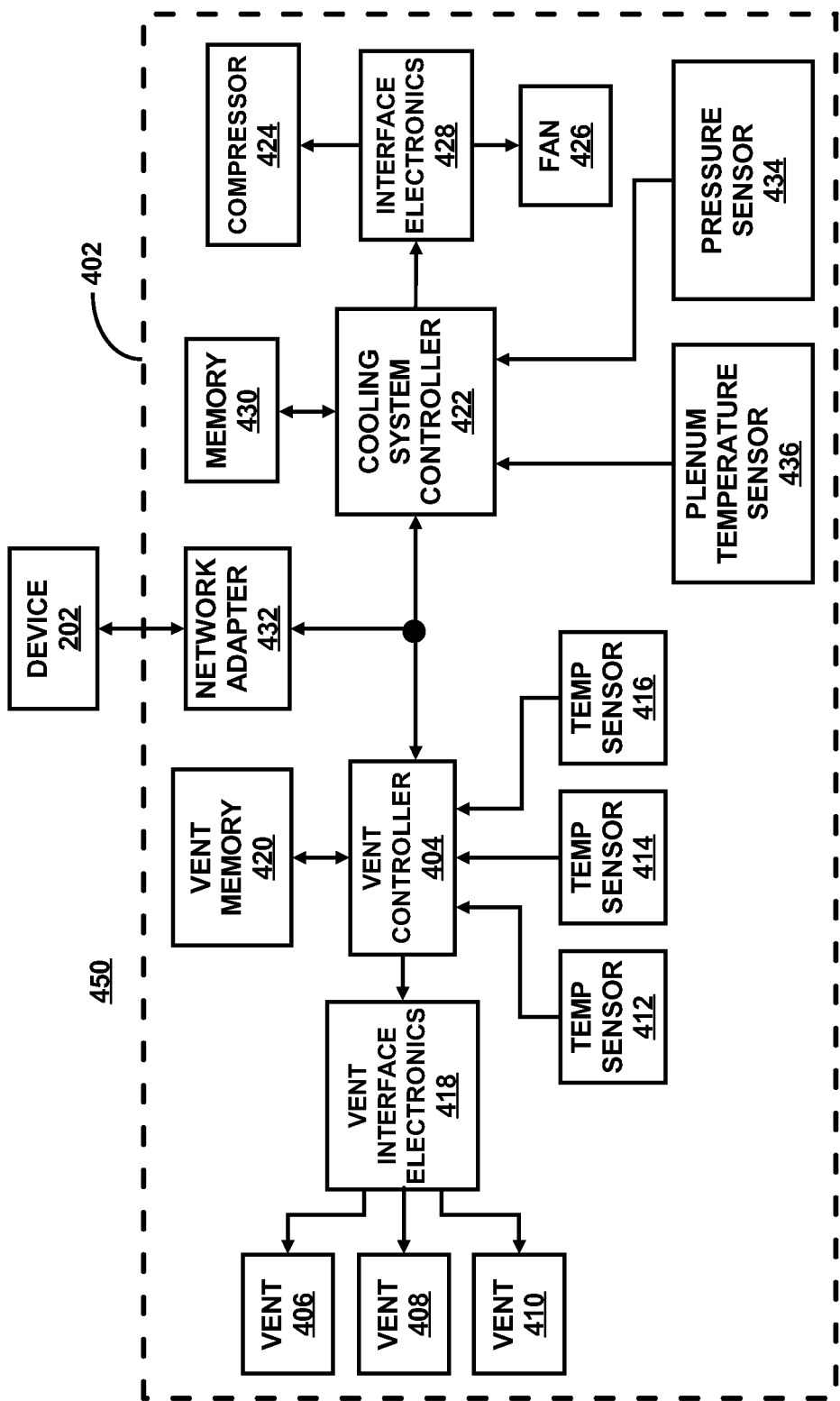
FIG. 4B illustrates an exemplary block diagram for a cooling system according to another embodiment of the invention.

In FIG. 4B, there is illustrated a block diagram 450 for a cooling system 402 according to an embodiment of the present invention. The elements illustrated in the block diagram 450 operate in substantially the same manner as those elements illustrated in the block diagram 400. However, one difference lies in the substantially independent operability of the data center controller 422. That is, operation of the data center controller 422 may not be directly related to the operation of the vent controller 404. Because of the apparent similarities between the block diagrams 400 and 450, only those elements necessary for a thorough understanding of the block diagram 450 will be described hereinbelow.

A pressure sensor 434 is configured to measure the pressure within the second chamber 348b of the space 316 (e.g., plenum) as described hereinabove. The pressure measurements and/or any discernable changes in the pressure measurements obtained by the pressure sensor 434 may be relayed to the data center controller 422. In addition, a plenum temperature sensor 436 may be configured to measure the temperature of the fluid within the second chamber 348b. The temperature measurements and/or any discernable changes in the temperature obtained by the plenum temperature sensor may also be relayed to the data center controller 422.

The data center controller 422 may manipulate the capacity of the compressor 424 and/or heat exchanger (not shown) based upon the measured temperature of the cooling fluid.

That is, the temperature of the fluid within the second chamber 348b may be maintained at a substantially constant level by manipulation of the compressor 424 (heat exchanger). Further, the output of the fan 426 may be manipulated based upon the measured pressure of the fluid in the second chamber 348b to vary the amount of cooling fluid supplied to space 316, to thereby substantially maintain the pressure of the cooling fluid within the second chamber 348b at a substantially uniform level. Thus, the data center controller 422 is operable to increase the speed of the compressor 424 (capacity of the heat exchanger) and the fan 426 output, e.g., expend a greater amount of energy, substantially as the heat loads in the racks 318a-318d requires such an increase. Consequently, the compressor 424 (heat exchanger) and the fan 426 are not operated at a substantially constant energy level and the amount of energy necessary is substantially lower than that of conventional cooling systems that typically operate at maximum energy levels.

The memory 430 may also be configured to store data/information pertaining to the control of the compressor 424 speed (heat exchanger capacity) and the output of the fan 426 corresponding to the measured pressure with the second chamber 348b. For example, the data center controller 422 may increase the compressor 424 speed (heat exchanger capacity) and fan 426 output by a relatively large amount in response to a relatively large decrease in the measured pressure. In this respect, the pressure within the second chamber 348b may be maintained at a substantially uniform level even when the pressures change by a relatively sharp amount.

The data center controller 422 may be interfaced with a device controller and/or a data logger of a device, e.g., device controller 204 and/or data logger 220 of device 202 illustrated in FIG. 2. The interface may be executed through a network adapter 436. The network adapter 436 may enable communication between the data center controller 422 and the device controller 204 and/or the data logger 220 of the device 202. In this respect, information from the data center controller 422 may be transmitted to the device controller 204. In addition, information may be transmitted from the data logger 220 to the data center controller 422. By way of example, information related to the location of hot spots detected by the temperature sensors 412-416 may be transmitted to the device controller 204. Moreover, information from the data logger 220 obtained from the sensors 206a-230 may be transmitted to the data center controller 422. The communication between the data center controller 422 and the device controller 204 and/or the data logger 220 may be effectuated by a wired protocol, such as IEEE 802.3, etc., a wireless protocol, such as IEEE 801.11b, wireless serial connection, Bluetooth, etc., or combinations thereof.

The vent controller 404 may also communicate with the device 202 to instruct the device 202 to follow predetermined routes and/or to deviate from a planned route, for instance, to travel to a detected hot spot. Hot spots may not necessarily correspond in exact location to any given temperature sensor, but may be located between various temperature sensors. Therefore, the device 202 may be instructed to travel to a detected hot spot location to detect the relatively accurate location of the detected hot spot, in both latitudinal and longitudinal coordinates. In this respect, a relatively fewer number temperature sensors may be employed without a substantial reduction in the effectiveness of the cooling arrangement.

Figure 5:
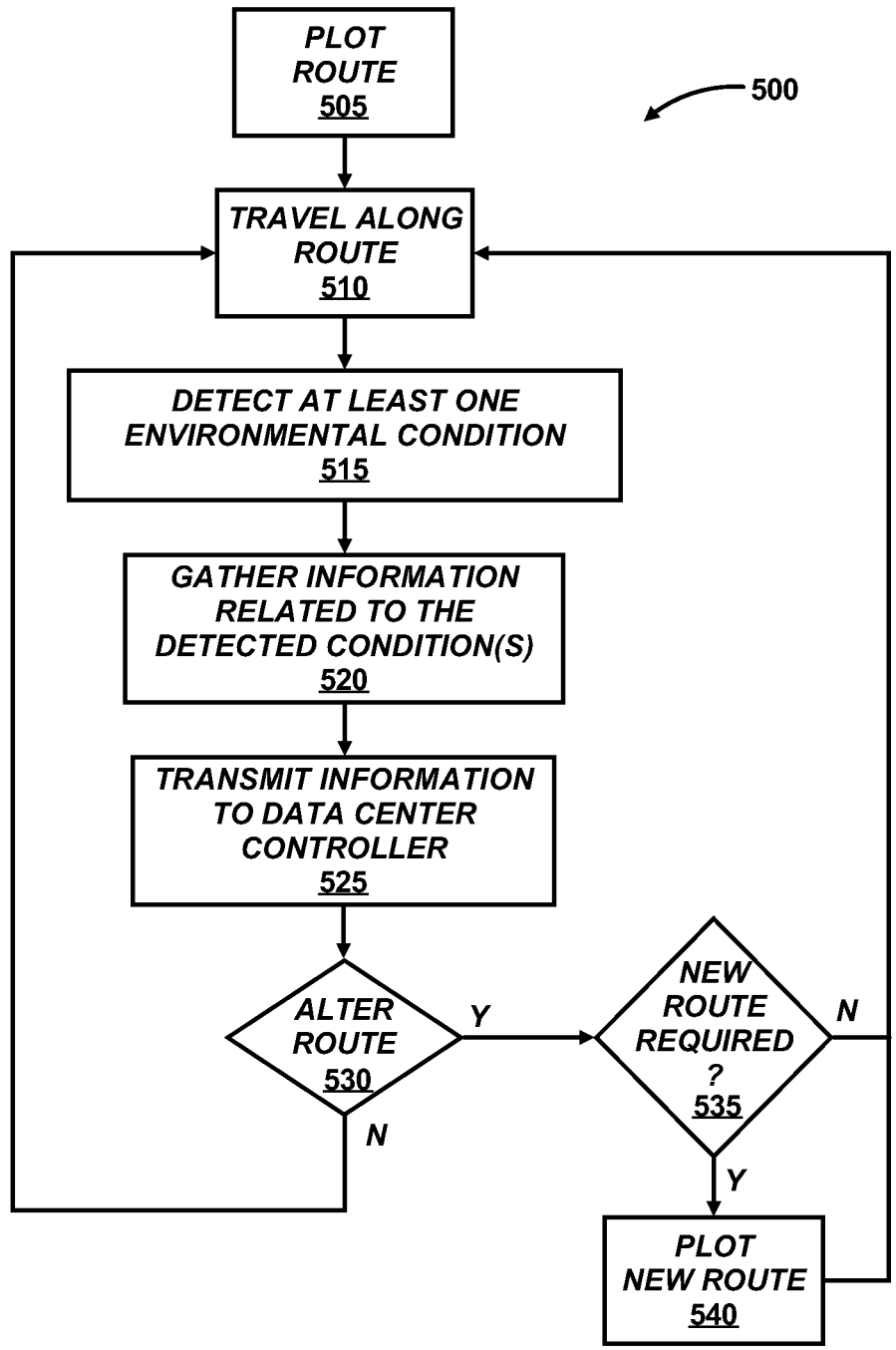
FIG. 5 shows an exemplary flow diagram according to an embodiment of the invention.

FIG. 5 shows a flow diagram of an operational mode 500 according to an embodiment of the invention. It should be understood that the operational mode 500 may include additional operations and that some of the operations may be removed and/or modified without departing from the scope and spirit of the invention. The following description of the operational mode 500 is made with reference to the block diagram 200 illustrated in FIG. 2, and thus makes reference to the elements cited therein.

The operations illustrated in the operational mode 500 may be contained as a utility, program, subprogram, in any desired computer accessible medium. In addition, the operational mode 500 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the operational mode 500, a route may be plotted for the device 202 to follow at step 505. The route may be plotted to enable the device 202 to travel through substantially all of the accessible locations throughout a data center. Alternatively, the route may be plotted to travel to those locations within a data center that are known to contain racks having components that are in operation. For example, certain components may be used at various times during a day whereas certain other components may be used at various other times during a day. In this respect, the device 202 may be implemented in a substantially optimized manner.

The route may be devised by the device controller 204. Alternatively, the route may be devised by the data center controller 222. By way of example, at least one of the device controller 204 and the data center controller 222 may be configured to determine when certain components will be implemented and devise the route accordingly. The determination may be based upon past occurrences or it may be based upon predictions of future usage.

At step 510, the device 202 may travel through the data center according to the plotted route. During travel through the data center, the device 202 may be configured to vary its course if it detects certain obstacles along its path as described hereinabove. The device 202 may detect these obstacles through use of the guidance sensor 214. The device 202 may be configured to detect at least one environmental condition, e.g., temperature, humidity, airflow, etc., at step 515. The detection of the at least one environmental condition may be performed as the device 202 travels through the data center. Alternatively, the device 202 may be configured to either reduce its speed or substantially stop to perform the detection.

The detection condition(s) is gathered, for example, by the data logger 220, as indicated at step 520. The data logger 220 may transmit, e.g., through the network adapter 224, the gathered information to the data center controller 222 at step 525. The transmission of the information may occur in a substantially continuous manner or it may occur at predetermined times, e.g., after a predetermined number of condition readings, after a predetermined time period, etc. The data center controller 222 may utilize the information received from the data logger 220 to control the delivery of cooling fluid to the racks (discussed in greater detail hereinbelow).

At step 530, the device controller 204 may determine that a change in course may be necessary. A change in course may be determined by detection of a hot spot by the data center controller 222. By way of example, if the data center controller 222 detects a hot spot, e.g., through one or more of the temperature sensors 212-216, the data center controller 222 instruct the device controller 204 to alter its course and travel toward the detected hot spot. Therefore, in those instances where the hot spot occurs at a location that falls, for example, between temperature sensors 212 and 216, the device 202 may more accurately determine where the hot spot is located. The data center controller 222 may then operate one or more of the vents, e.g., vents 206-210 to increase its cooling fluid flow to substantially cool the hot spot.

If there are no hot spots, the device 202 may continue along its plotted route as indicated at step 510. Additionally, the condition(s) detection, gathering, and transmission may continue for a predetermined period of time or until such time as it is determined that a change in the device's plotted route is required.

If the route requires alteration, e.g., a hot spot is detected, it is determined whether a new route is required at step 535. A new route may unnecessary if, for example, the hot spot occurs at a location that is substantially along the device's 202 current route and a substantially faster route does not exist. If a new route is determined to be necessary, e.g., the hot spot is detected at a location that is not substantially in the current direction of travel, a new route may be plotted as indicated at step 540. The new route may be plotted by either the device controller 204 or the data center controller 222. The new route may be designed, for example, according to the shortest distance between the device's 202 current location and the location of the detected hot spot. It should be understood, however, the new route may be fashioned in any other reasonably suitable manner. The device controller 204 may then alter the course of the device 202 to follow the new route.

In the vicinity of the detected hot spot, the device 202 may perform the operations listed at steps 515 and 520. Upon completion of steps 515 and 520, the device 202 may return to its previous location and resume its original route or it may reprogrammed to follow another route.

Figure 6A:
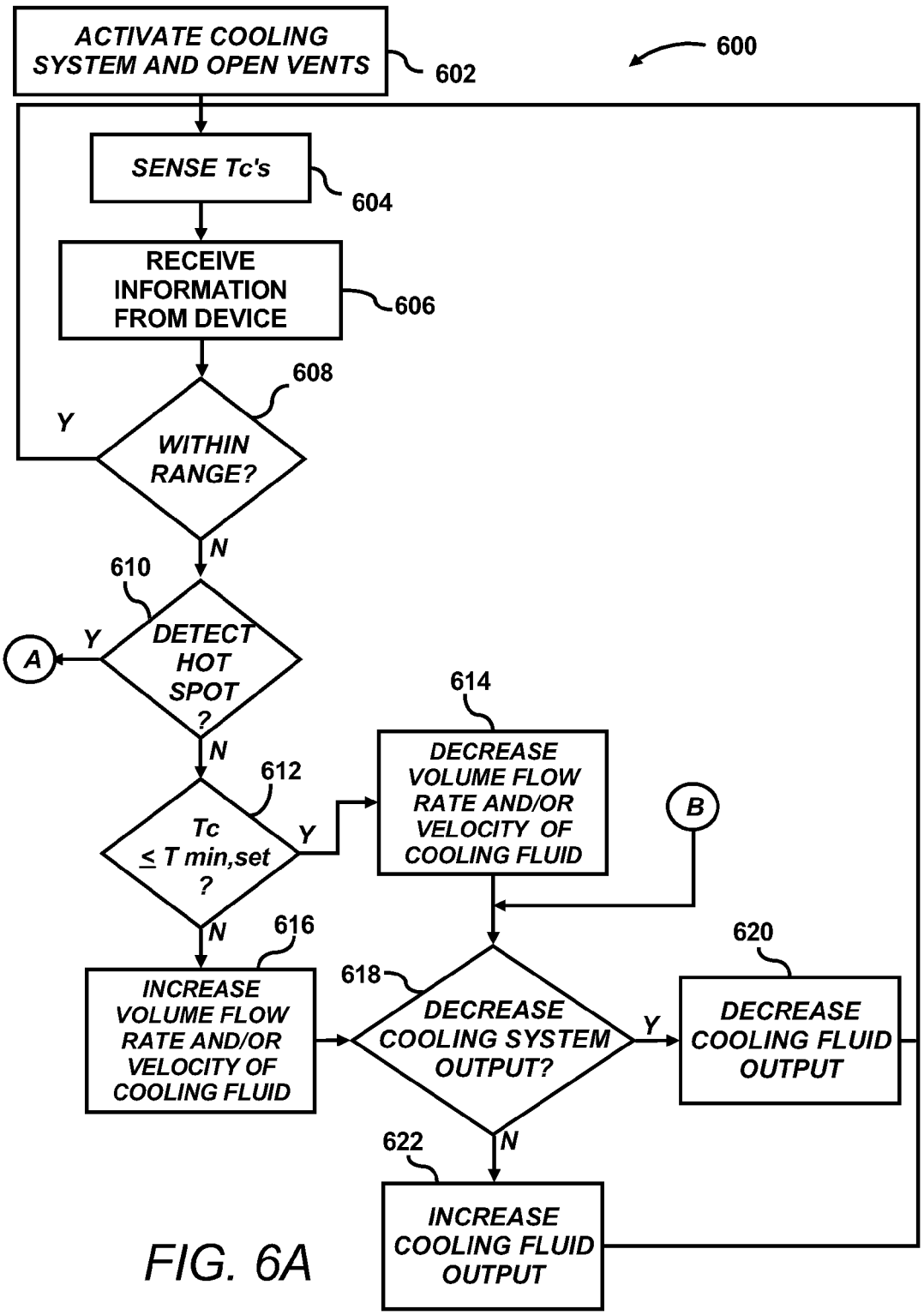
FIGS. 6A-6B, collectively, illustrate an exemplary flow diagram according to another embodiment of the invention.

FIG. 6A shows a flow diagram of an operational mode 600 according to an embodiment of the present invention. The following description of the operational mode 600 is made with reference to the block diagram 400 illustrated in FIG. 4A, and thus makes reference to the elements cited therein. It is to be understood that the steps illustrated in the operational mode 600 may be contained as a utility, program, subprogram, in any desired computer accessible medium. In addition, the operational mode 600 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the operational mode 600, the cooling system 402 is activated and the vents 406-410 are opened at step 602. The temperature of a component (Tc) generally corresponds to the heat load of the heat dissipating components and therefore the subsystems contained in the racks 318a-318d. Therefore, the Tc's may be based upon the temperatures of specific heat dissipating components and subsystems. In addition, the Tc's may be based upon the temperatures in the general vicinity of the racks and/or sections of the racks. Thus, those skilled in the art will understand that certain embodiments of the present invention may be employed with the temperature sensors 412-414 located at various positions throughout the data center. Moreover, use of the term "rack" herein generally refers additionally to sections of the racks and thus may not necessarily refer to an entire rack. Thus, the use of the term "rack" throughout the present disclosure is not meant to limit certain aspects to entire racks, but instead, is implemented to simplify the description of certain embodiments of the present invention.

At step 604, the temperatures of the components (Tc's) are individually sensed by the temperature sensors 412-416. Alternatively, the Tc's may be anticipated in the manner described hereinabove with respect to FIG. 4A.

In addition to sensing the Tc's as described above, the Tc's may be received from an environmental condition detecting device, e.g., device 202 illustrated in FIG. 2. In this regard, the data center controller 222 may receive the Tc's detected by the device 202, at step 306. Moreover, the Tc's detected by the device 202 may signify the temperatures around the vicinity of various racks and more particularly, various components.

At step 608, it is determined whether each of the measured temperatures are individually within a predetermined range of operating temperatures, e.g., between a maximum set point temperature (Tmax,set) and a minimum set point temperature (Tmin,set). The predetermined range of operating temperatures may be set according to a plurality of factors. These factors may include, for example, the operating temperatures set forth by the manufacturers of the subsystems and components located in the racks, through testing to determine the optimal operating temperatures, etc. In addition, the predetermined range of operating temperatures may vary from one subsystem to another on the basis that various subsystems generally may operate effectively at various temperatures.

If it is determined that all of the Tc's are within range, the measured and/or anticipated temperatures for those racks determined to have heat loads that fall within the predetermined range of operating temperatures, are sensed again at step 604. For those racks determined to have heat loads that do not fall within the predetermined temperature range, i.e., fall outside of Tmin,set and Tmax,set, it is determined whether a hot spot is detected at step 610. The hot spot, for example, may exist when the temperature is detected to be at a predetermined temperature above the Tmax,set.

For those locations where hot spots are not detected, it is determined whether the sensed temperature equals or falls below the Tmin,set at step 612. In general, the range of temperatures Tmin,set and Tmax,set pertains to threshold temperatures to determine whether to increase or decrease the flow of cooling fluid delivered to the racks. The predetermined temperature range may be based upon a plurality of factors, for example, a threshold operating range of temperatures that may be determined through testing to substantially optimize the performance of the subsystems contained in the racks. Moreover, the predetermined temperature range may vary for each rack because various components generally may operate effectively at various temperatures and thus various threshold temperatures may be optimal.

If the Tc's of some of the racks are below or equal to the Tmin,set, the vent controller 404 may operate to decrease the volume flow rate and/or the velocity of cooling fluid to those racks at step 614. The determination of whether to decrease either or both the volume flow rate and the velocity of the cooling fluid may be based upon the detected temperature of the racks. For example, if the subsystems on a bottom half of a rack are operating at 50 percent of maximum capacity, and the subsystems on an upper half of the rack are operating at or near zero capacity, the velocity of the cooling fluid may be reduced whereas the volume flow rate may remain substantially constant. This may occur, for example, because the cooling fluid need not travel a relatively long distance but may still need to supply the bottom half with a sufficient amount of cooling fluid.

If the Tc's of some of the racks exceed the Tmin,set (i.e., also exceed the Tmax,set), the vent controller 404 may operate to increase the volume flow rate and/or the velocity of cooling fluid to those racks at step 616. The determination of whether to increase either or both the volume flow rate and the velocity of the cooling fluid may be based upon the detected temperature of the racks. For example, if the subsystems on the top half of a rack are operating at 100 percent capacity, and the subsystems on a bottom half of the rack are operating at or near zero capacity, the velocity and the volume flow rate of the cooling fluid may both be increased. This may occur, for example, because the cooling fluid must travel a relatively long distance and supply the top half with a sufficient amount of cooling fluid.

According to an embodiment of the invention, the decrease in volume flow rate and/or velocity of the cooling fluid flow at step 310 and the increase in volume and/or velocity of the cooling fluid at step 614 may be accomplished by incrementally varying the cooling fluid flow through the vents. An example will be made for the instance where a vent allows a certain amount of cooling fluid to flow therethrough, and the vent is manipulated to decrease the volume flow rate of the cooling fluid, and where the decrease in fluid flow is insufficient to cause the Tc for that rack to fall within the predetermined range. In this instance, during a subsequent run through steps 604-614, the vent may be controlled to further decrease the volume flow rate of the cooling fluid therethrough by an incremental amount. By repeating this process a number of times, the temperature of the rack may be substantially brought within the predetermined range.

At step 618, the data center controller 422 may determine whether to decrease the cooling fluid output, e.g., decrease the compressor 424 speed and the fan 426 output. The determination of whether to decrease the cooling fluid output may be made in response to the manipulations made to the vents 406-410 by the vent controller 404. For instance, if the total amount of decreases in the volume flow rates of the cooling fluid exceeds the total amount of increases in the volume flow rates flow of the cooling fluid, the data center controller 422 may operate to decrease the cooling fluid output at step 620. Alternatively, if the total amount of increases in the volume flow rates of the cooling fluid exceeds the total amount of decreases, the data center controller 422 may operate to increase the cooling system output, e.g., decrease the temperature of the cooling fluid, at step 622.

In addition, the plenum temperature sensor 436 may be implemented by the data center controller 422 to determine if and how the temperature and supply of cooling fluid should be adjusted. By way of example, if a relatively large amount of cooling fluid is being used to cool one or more components, the temperature within the plenum 316 may increase. This increase may cause the cooling system 402 to output cooling fluid having a lower temperature, e.g., increase the capacity of the compressor 424 and/or the heat exchanger.

Following steps 620 or 622, or if the increases in the volume flow rates of the cooling fluid through the vents equals the decreases, for example, the Tc's are sensed again at step 604. In addition, the steps following step 604 may be repeated for an indefinite period of time so long as the cooling system 402 is in operation.

It should be appreciated that the Tc's of some of the racks may fall below the Tmin,set, whereas the Tc's of other racks may exceed the Tmax,set. Thus, it should be appreciated that steps 614 and 616 may be respectively and substantially simultaneously performed on the various racks. It should also be appreciated that changes in cooling fluid flow through one or more of the vents 406-410 may affect fluid flow through one or more of the other vents 406-410. The vent controller 404 may operate to compensate for these types of affects by adjusting one or more of the affected vents.

Figure 6B:
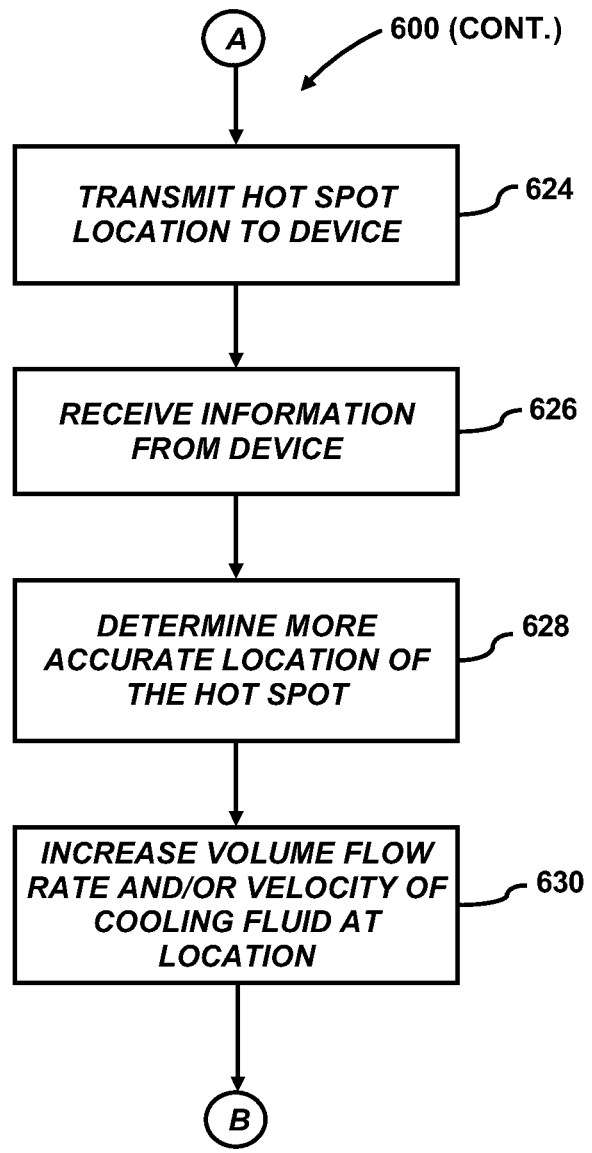

If a hot spot is detected, at step 610, the location of the detected hot spot may be transmitted to the device, e.g., device 202, at step 624 (FIG. 6B). The device 202 may travel to the location of the detected hot spot as described above with respect to FIG. 5. The device 202 may then detect the temperature at the hot spot location as well as its surrounding area. The information gathered by the device 202 may be transmitted to the data center controller 422 at step 626.

The data center controller 422 may process the received information and determine a more accurate location of the hot spot, as indicated at step 628. At step 630, the data center controller 422 may then instruct one or more vents, e.g., vent 406, to increase the volume flow rate and/or velocity of the cooling fluid delivered to the rack(s) at the location.

Figure 7A:
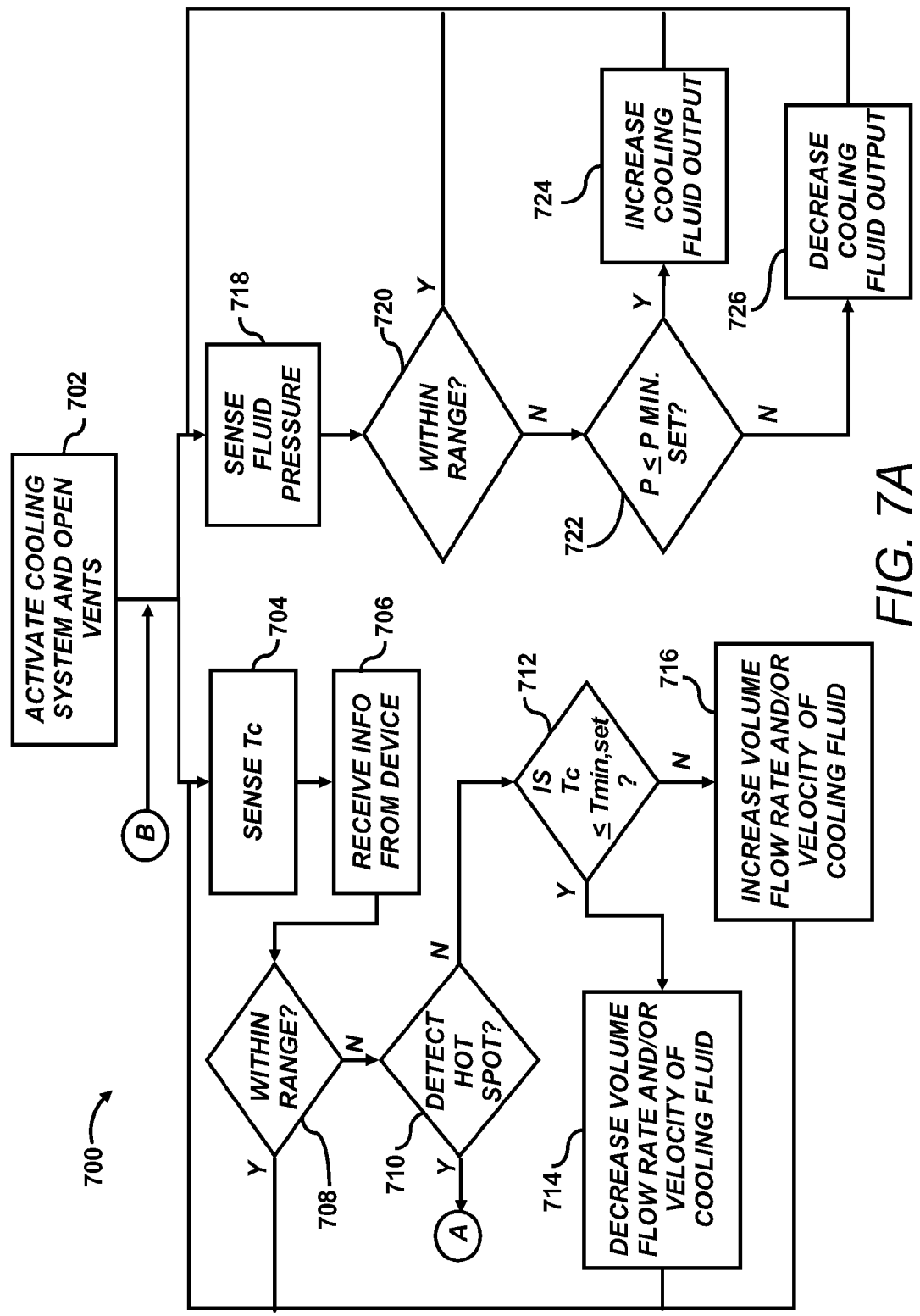
FIGS. 7A-7B, collectively, illustrate an exemplary flow diagram according to yet another embodiment of the invention.
Figure 7B:
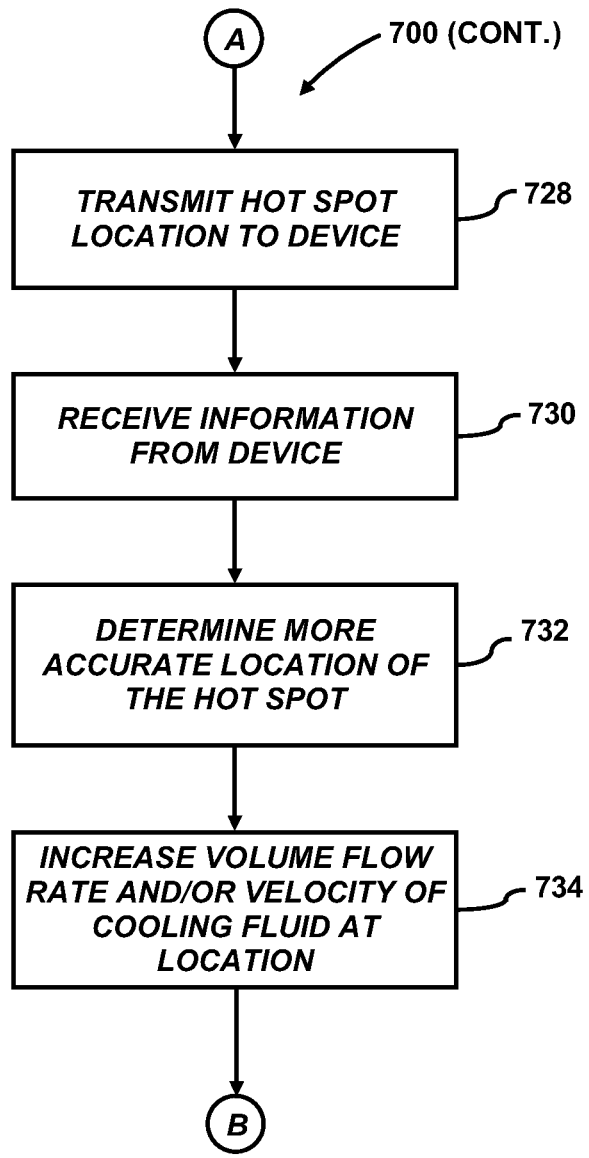

FIG. 7A shows a flow diagram of an operational mode 700 according to another embodiment of the present invention. The following description of the operational mode 700 is made with reference to the block diagram 450 illustrated in FIG. 4B, and thus makes reference to the elements cited therein. It is to be understood that the steps illustrated in the operational mode 700 may be contained as a utility, program, subprogram, in any desired computer accessible medium. In addition, the operational mode 700 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the operational mode 700, steps 702-716 and 728-734 respectively correspond to steps 602-616 and 624-630 recited hereinabove with respect to the operational mode 600 illustrated in FIGS. 6A and 6B. Therefore, a detailed description of steps 702-716 and 728-734 will not be made herein. Instead, one of ordinary skill in the art will readily recognize that the description made hereinabove with respect to steps 602-616 and 624-630 has general applicability to steps 702-716 and 728-734 and may thus be used interchangeably.

Therefore, beginning at step 718, the pressure of the cooling fluid supplying the vents 406-410 may be measured by a pressure sensor 432. The measured pressure may be relayed to the data center controller 422. The data center controller 422 may determine whether the measured pressure is within a predetermined pressure range, e.g., a predetermined minimum set point pressure (Pmin,set) and a predetermined maximum set point pressure (Pmax,set), at step 720. The predetermined pressure range may be set according to a maximum desired volume flow rate and/or velocity of the cooling fluid to be ejected through the vents 406-410. In addition, the predetermined pressure range may be the substantial optimum operating pressure desired for controlling the flow of cooling fluid through the vents. If the measured pressure is within the predetermined pressure range, the data center controller 422 may repeat step 718.

If the measured pressure is not within the predetermined pressure range, it is determined whether the measured pressure (P) is below or equal to a minimum pressure set point (Pmin,set) at step 722. In general, the predetermined pressure range pertains to the threshold pressures to determine whether to increase or decrease the supply of fluid, e.g., in the second chamber 348b. The predetermined pressure range may be based upon a plurality of factors, for example, a threshold operating pressure or range of pressures that may be determined through testing to substantially optimize the performance of the cooling fluid output through the vents 406-410.

It should be understood that the predetermined pressure set point may vary depending upon one or more factors. By way of example, the predetermined pressure set point may be reduced if the total load on the data center, or a section of the data center decreases such that at least some of the vents, e.g., vents 406-410, are operating substantially at their lowest setting, the predetermined pressure set point may be reduced for a sensor, e.g., sensor 412, that affects operation of the cooling system 402 in the area of these vents.

If the P is determined to be below or equal to the Pmin,set, the data center controller 422 may operate to increase the cooling fluid output, e.g., by increasing the compressor capacity and/or the fan output, at step 724. Otherwise, if the P is determined to exceed the Pmin,set, and thereby exceed the Pmax,set, the data center controller 422 may operate to decrease cooling fluid output, e.g., by decreasing the compressor capacity and/or the fan output, at step 726.

Following steps 724 or 726, the data center controller 422 may repeat step 718. In addition, the steps following step 718 may be repeated for an indefinite period of time so long as the cooling system 202 is in operation.

Figure 8:
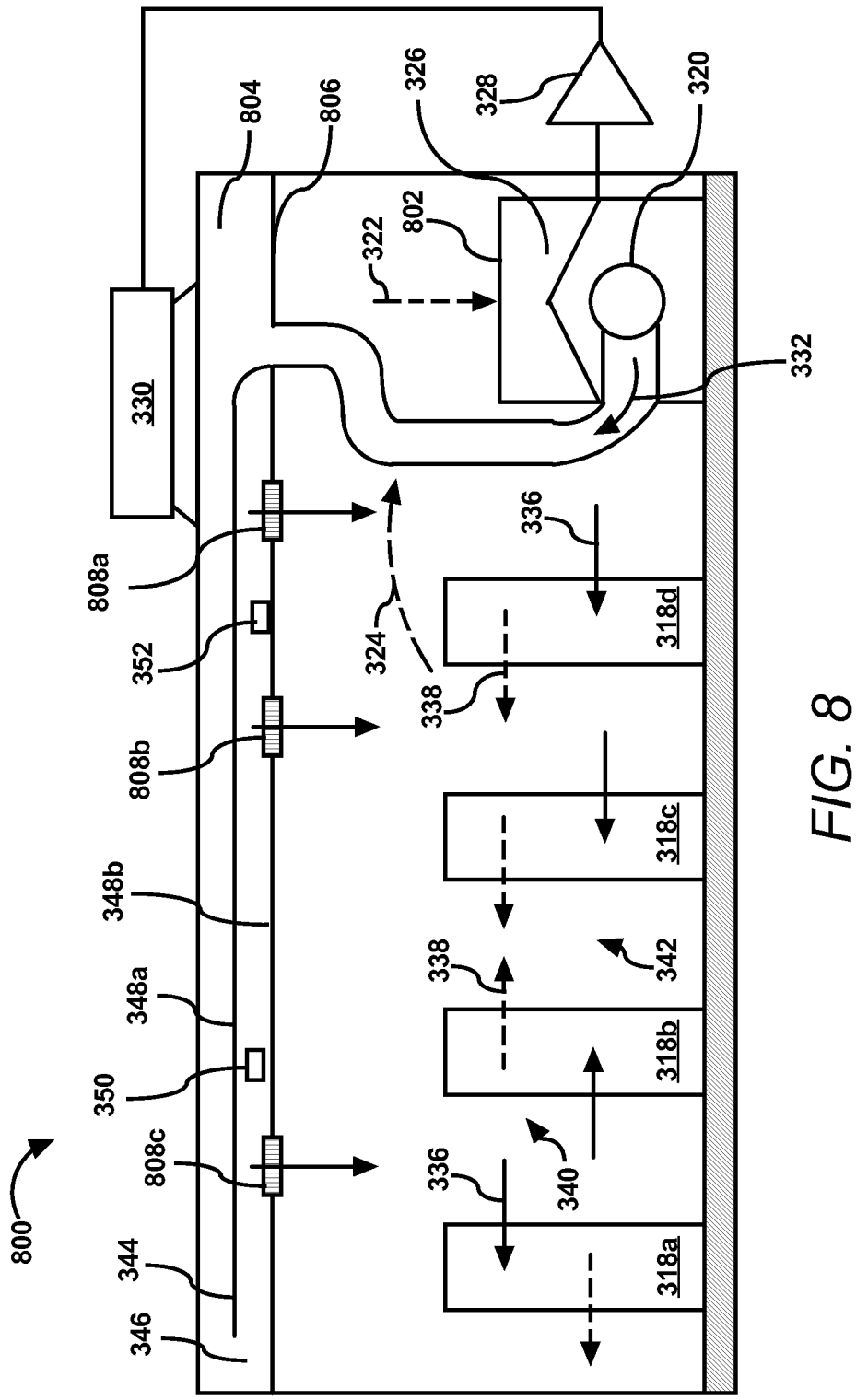
FIG. 8 shows a simplified schematic illustration of the data center illustrated in FIG. 3 containing a cooling system in accordance with an alternate embodiment of the present invention.

FIG. 8 illustrates an alternate embodiment of the present invention. As shown in FIG. 8, the data center 800 includes a cooling system 802 configured to supply cooling fluid, e.g., air through a space 806 (e.g., plenum) located above a lowered ceiling 804. This embodiment operates in a similar manner to the embodiment illustrated in FIG. 3. One difference between the embodiment illustrated in FIG. 8 and the embodiment illustrated in FIG. 3 is that the cooling fluid is supplied from a location above the racks 318a-318d. It should be understood that the vents 806a-806c operate to supply cooling fluid to the racks 318a-318d in much the same manner as that described hereinabove with respect to FIG. 3. Therefore, the description set forth hereinabove with respect to the above-described embodiments are relied upon to provide a description of the embodiment illustrated in FIG. 8.

Although not specifically illustrated in FIG. 8, it is within the purview of certain embodiments of the invention that the vents 408a-408c may be provided at any reasonably suitable location within the data center 800. By way of example, one or more vents 408a-408c may be provided on the lowered ceiling 348b with one or more of the vents 408a-408c being provided on a raised floor, e.g., 314 (FIG. 3). In addition, one or more vents 408a-408c may be provided along one or more walls of the data center. Therefore, the vents 408a-408c and the cooling fluid delivered therefrom may be arranged in a variety of different combinations. The different combinations of placements may be selected according to desired air flow patterns, cost, cooling requirements, and like considerations.

In accordance with embodiments of the present invention, the cooling requirements within a data center may be analyzed to substantially optimize the layout of the racks within the data center. In one respect, the substantial optimization of the rack layout in the data center may enable the cooling system of the data center to operate at generally lower energy and greater efficiency levels by virtue of the reduced workload placed on the components of the cooling systems, e.g., compressors, fans, etc. The cooling requirements within the data center may be analyzed by operation of any reasonably suitable commercially available computational fluid dynamics (CFD) tool, e.g., FLOVENT, a 3-D modeling software capable of predicting temperature variations based upon fluid flows. By virtue of the numerical modeling, various air conditioning units as well as the vents described hereinabove may be positioned throughout the data center to substantially control the manner in which the racks receive the cooling fluid.

In addition, the air conditioning units may also be positioned to substantially maximize and optimize their performances, e.g., to prevent one or more of the air conditioning units from being overworked.

In determining the cooling fluid distribution requirement within the data center, each of the racks may be assigned a heat load which may correspond to a maximum heat load predicted for that rack, e.g., through anticipated power draw. For example, a rack containing 40 subsystems, e.g., computers, may have a maximum heat load of 10 KW and a rack containing 20 subsystems may have a maximum heat load of 5 KW. By implementing the CFD in this manner, for example in a data center containing 100 racks and four air conditioning units, racks having a potential for relatively larger heat loads may be relatively separately located throughout the data center. In one respect, therefore, the air conditioning units within the data center may be operated at substantially less than maximum power levels and the racks may receive sufficient amounts of cooling fluid. More specifically, the power required to operate the air conditioning units may be regulated to efficiently cool the fluid supplied to the racks by providing substantially only that amount of cooling fluid necessary to maintain the racks within normal operating temperatures.

According to another exemplary embodiment of the present invention, a CFD tool may be implemented substantially continuously with the embodiments described hereinabove. More specifically, the CFD tool may be utilized to substantially continuously vary the operation of the cooling system to operate according to the heat loads generated in the racks. In this regard, the anticipated or actual heat loads (e.g., based upon the power draw of the components) on the racks may be inputted into the CFD tool, along with one or more of the following properties: velocity of the cooling fluid flowing through various sections of the data center and the distribution of temperature and pressure of the cooling fluid in the data center, to determine an optimal manner in which the air conditioning units may be operated as well as the flow of the cooling fluid through the vents to adequately cool the racks based upon an analysis of the data center layout and the heat loads. The velocity of the air flow as well as other atmospheric conditions at various locations within the data center may be sensed by an environmental detection device, e.g., device 202. The sensed conditions may be transmitted or otherwise relayed to the CFD tool to enable the tool to perform the necessary calculations.

The CFD tool may be implemented to produce a numerical model of the data center to thus determine an optimized cooling distribution within the data center. A correlation of one or more of the following properties: velocity of the cooling fluid flowing through various sections of the data center, distribution of temperature and pressure of the cooling fluid in the data center, and the power draw into the racks, may be created based on the numerical modeling. The correlation may be used to infer thermal conditions throughout the data center when only a minimum number of sensors are available during operation of the cooling system. The device 202 may also be implemented to verify the thermal conditions depicted by the CFD tool. In addition, the correlation may substantially reduce the amount of time required for the CFD tool to perform the computing operations.

Thus, for example, with respect to FIG. 6A, at step 616, a numerical model may be created to analyze a substantially optimal manner in which the volume flow and/or the velocity of the cooling fluid may be increased while considering the effects of fluid flow from other racks. In this respect, based upon the analysis, the vent supplying that rack with cooling fluid and/or another vent may be caused to vary the volume flow and/or velocity of the cooling fluid. In addition, at step 618, the numerical model may be created to determine whether the cooling system output should be decreased based upon the heat loads and the fluid flow throughout the data center. For example, if it is determined that a rack with an increasing heat load may receive a sufficient amount of cooling fluid by receiving cooling fluid from a vent generally away therefrom, the cooling system output may not be increased. Thus, by implementation of the CFD tool to generally analyze the fluid flow characteristics and the temperatures of the racks, the amount of energy required to sufficiently cool the racks in the data center may be substantially optimized.

By virtue of certain embodiments of the present invention, one of ordinary skill in the art will readily recognize that the amount of energy, and thus the costs associated with cooling the racks located within a data center may be substantially reduced. In one respect, by operating the cooling system to supply cooling fluid substantially only as needed by the racks, the cooling system may be operated at a relatively more efficient manner as compared to conventional cooling systems.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for operating a device to detect at least one environmental condition in a data center, said method comprising:
   plotting a route for said device;
   maneuvering said device along said route; and
   detecting at least one environmental condition with said device in said data center.

2. The method according to claim 1, further comprising:
   gathering information related to said at least one detected environmental condition; and
   transmitting said information to a controller of said data center.

3. The method according to claim 2, wherein said step of gathering information comprises evaluating said information to determine a manner in which one of a vent and a cooling system may be manipulated.

4. The method according to claim 1, further comprising:
   receiving instructions to travel to a location determined to contain a hot spot; and
   maneuvering said device to said location.

5. The method according to claim 4, further comprising:
   determining whether a new route is required to maneuver said device to said location; and
   plotting a new route in response to said new route being required.

6. The method according to claim 1, wherein said step of detecting at least one environmental condition in said data center comprises detecting one or more of temperature, humidity, and air flow.

7. A method of cooling a plurality of components in a data center, said method comprising:
   activating a cooling system and opening a plurality of vents, each of said plurality of vents being configured to supply cooling fluid to at least one of said plurality of components;
   sensing temperatures in areas around said plurality of components;
   receiving temperatures from a movable device configured to detect at least one environmental condition at various locations of said data center;
   determining whether at least one of said sensed temperatures and said received temperatures are within a predetermined temperature range; and
   varying at least one of said supply of said cooling fluid to said components and the temperature of said cooling fluid in response to at least one of said sensed and received temperatures being outside of said predetermined temperature range.

8. The method according to claim 7, further comprising:
   determining whether at least one of the sensed and received temperatures is below a predetermined minimum set point temperature; and
   decreasing a supply of said cooling fluid to areas in said data center having one or more of sensed and received temperatures that fall below said predetermined minimum set point temperature.

9. The method according to claim 8, further comprising:
   increasing the supply of said cooling fluid to areas in said data center having one or more of said sensed and received temperatures that exceed said predetermined minimum set point temperature.

10. The method according to claim 7, further comprising:
decreasing an output of said cooling fluid from said cooling system in response to said decrease in cooling fluid supply to said areas exceeding said increase in cooling fluid supply to said areas, wherein decreasing the output comprises at least one of decreasing the temperature and speed of said cooling fluid supply.

11. The method according to claim 7, further comprising:
increasing an output of said cooling fluid from said cooling system in response to said decrease in cooling fluid supply to said area falling below said increase in cooling fluid supply to said areas, wherein increasing the output comprises at least one of increasing the temperature and speed of said cooling fluid supply.

12. The method according to claim 7, further comprising:
sensing a pressure of said cooling fluid;
determining whether said sensed pressure is within a predetermined pressure range; and
varying an output of said cooling system in response to said sensed pressure falling outside of said predetermined pressure range.

13. The method according to claim 12, wherein said step of varying said cooling system output includes determining whether said measured pressure falls below a predetermined minimum set point pressure.

14. The method according to claim 13, further comprising:
increasing the output of said cooling system in response to said measured pressure falling below or equaling said predetermined minimum set point pressure.

15. The method according to claim 13, further comprising:
decreasing the output of said cooling system in response to said measured pressure exceeding said predetermined minimum set point pressure.

16. The method according to claim 7, further comprising:
determining whether any hot spots exist in areas near said components.

17. The method according to claim 16, further comprising:
transmitting the location of a hot spot to said device in response to a determination of a hot spot existing near said components.

18. The method according to claim 16, further comprising:
utilizing said device to more accurately determine the location of the hot spot.

19. The method according to claim 18, further comprising:
increasing one or more of the volume flow rate and velocity of the cooling fluid supplied to said location of said hot spot.

20. The method according to claim 7, further comprising:
performing a numerical modeling of a temperature distribution and flow characteristics of air within the data center; and
manipulating said cooling system in response to said numerical modeling.

21. The method according to claim 20, further comprising:
implementing said numerical modeling to correlate at least two of temperature, velocity and pressure of said cooling fluid and power draw of said racks within said data center to thereby infer a thermal condition throughout said data center, wherein said manipulating step further comprises manipulating said cooling system in response to said inferred thermal condition.

22. The method according to claim 20, further comprising:
receiving information related to one or more of temperature, humidity, and air flow from said device; and
utilizing said received information in said step of implementing said numerical modeling.

* * * * *